(12) United States Patent
Bi

(10) Patent No.: US 7,227,618 B1
(45) Date of Patent: Jun. 5, 2007

(54) PATTERN GENERATING SYSTEMS

(76) Inventor: Baokang Bi, 3928 E. Sunwind Dr., Okemos, MI (US) 48864

( * ) Notice: Subject to any disclaimer, the term of this patent is extended or adjusted under 35 U.S.C. 154(b) by 338 days.

(21) Appl. No.: 10/708,778

(22) Filed: Mar. 24, 2004

(51) Int. Cl.
G03B 27/54 (2006.01)
(52) U.S. Cl. .......................... 355/67; 355/71; 355/230; 355/565; 355/576
(58) Field of Classification Search ................ 359/213, 359/230, 565
See application file for complete search history.

(56) References Cited

U.S. PATENT DOCUMENTS

| | | | |
|---|---|---|---|
| 4,571,603 A | 2/1986 | Hornbeck et al. | 347/239 |
| 5,311,360 A | 5/1994 | Bloom et al. | 359/572 |
| 5,360,973 A | 11/1994 | Webb | 250/370.01 |
| 5,459,610 A | 10/1995 | Bloom et al. | 359/572 |
| 5,629,801 A | 5/1997 | Staker et al. | 359/572 |
| 5,841,579 A | 11/1998 | Bloom et al. | 359/572 |
| 5,900,637 A | 5/1999 | Smith | 250/492.22 |
| 5,969,362 A | 10/1999 | Kawata et al. | 250/398 |
| 5,982,553 A | 11/1999 | Bloom et al. | 359/627 |
| 6,014,203 A | 1/2000 | Ohkawa | 355/68 |
| 6,133,986 A | 10/2000 | Johnson | 355/67 |
| 6,177,980 B1 | 1/2001 | Johnson | 355/67 |
| 6,335,783 B1 | 1/2002 | Kruit | 355/67 |
| 6,498,685 B1 | 12/2002 | Johnson | 359/621 |
| 6,544,698 B1 | 4/2003 | Fries | 355/53 |
| 6,552,779 B2 | 4/2003 | Mei | 355/71 |
| 2002/0071172 A1 | 6/2002 | Naiki | 359/305 |
| 2003/0122091 A1 | 7/2003 | Almogy | 250/492.24 |
| 2003/0123040 A1 | 7/2003 | Almogy | 355/69 |
| 2004/0124372 A1* | 7/2004 | Gil et al. | 250/492.2 |

FOREIGN PATENT DOCUMENTS

| WO | WO 98/48443 | 10/1998 |
|---|---|---|
| WO | WO 03/079116 | 9/2003 |

OTHER PUBLICATIONS

Arnaud Bertsch, et al., "Rapid Prototyping of small size objects", Rapid Prototyping Journal, vol. 6, p. 259, 2000.
http://www.micronic.se/site_eng/product/multiexposure.shtml, Publication date on website is unknown.
H. J. Tiziani, et al., "Theoretical Analysis of Confocal Microscopy with Microlenses", Applied Optics, vol. 35, p. 120, 1996.
Emily A. Gibson, et al., "High-Order Harmonic Generation up to 250 eV from Highly Ionized Argon", Physical Review Letters, vol. 92, 033001-3, 2004.
C. keyser, et al., "Studies of high-repetition-rate laser plasma EUV sources from droplet targets", Applied Physics A, vol. 77, p. 217, 2003.

(Continued)

Primary Examiner—D. Rutledge

(57) ABSTRACT

A pattern generating system for generating two-dimensional images on a surface includes a light source and one or more Zone Plate Modulator (ZPM) arrays. The ZPM arrays comprise diffractive zone plate modulating elements that are capable of either diffracting or reflecting an incident light according to the image data. In a high-resolution pattern generating system, ZPM arrays are used as spot array generators. A complete high-resolution image is formed by scanning individual light spots in the spot array using a subfield scanning means.

29 Claims, 28 Drawing Sheets

OTHER PUBLICATIONS

E. Kaneko, "Liquid Crystal TV Displays", KTK Scientific Publishers, Boston, 1987, Chapter 8.

H. J. Tiziani, et al., "Three-Dimensional Analysis by a Microlens-Array Confocal Arrangement", Applied Optics, vol. 33, p. 567, 1994.

Neha Choksi, et al., "Maskless extreme ultraviolet lithography", J. Vac. Sci. Technol. B 17, p. 3047, 1999.

http://pguerit.sri.com/SriWeb/current/DPS.html, "Direct photo shaping", Publication date on website is unknown.

Srinivas Bollepalli, et al., "Image formation in extreme ultraviolet lithography and numerical aperture effects", J. Vac. Sci. Technol. B(17), p. 2992, 1999.

Ihsan Dhomehri, et al., "Zone-plate-array lithography in the deep ultraviolet", J. Vac. Sci. Technol. B(16), p. 3426, 1998.

J. W. Gardner, "Microsensors, MEMS, and Smart Devices", John Wiley & Sons, Ltd., New York, 2001, Chapter 7.

Dario Gil, et al., "Parallel maskless optical lithography for prototyping, low-volume production, and research", J. Vac. Sci. Technol. B(20), p. 2597, 2002.

Paul Allen, "DUV Laser Scanning for Mask Pattern Generation at the 130 and 100 Nanometer Nodes", http://www.appliedmaterials.com/products/mask_tech_archives.html, Mar. 2002.

http://www.mapperlithography.com/principle/principle.htm, "MAPPER Technology", Publication date is unknown.

Hans Coufal, et al., "Optical data storage", International Trends in Optics, p. 609(2002), Published by SPIE—The International Society for Optical Engineering.

John E. Bjorkholm, "EUV Lithography -The Successor to Optical Lithography?", Intel Technology Journal, Q3 '98.

J. Paufler, et al., "High-throughput optical direct write lithography", Solid State Technology, p. 175, Jun. 1997.

Eiichi Tamaki, "Computer-to-plate printing using the Grating Light Valve(TM) device", Proceedings of SPIE, vol. 5348, p. 89, 2004.

Stephen D. Senturia, "Microsystem Design", Kluwer Academic Publisers, Boston, 2000, Chapter 20.

Jahja I. Trisnadi, et al., "Overview and applications of Grating Light Valve (TM) based optical write engines for high-speed digital imaging", Proceedings of SPIE, vol. 5348, p. 52, 2004.

R. W. Corrigan, et al., "Grating Light Valve (TM) Technology for Projection Displays", International Display Workshop, Kobe, Japan, Dec. 1998.

L. Hornbeck, "Digital Light Processing (TM) for High -Brightness, High -Resolution Applications", Proceedings of SPIE, vol. 3013, p. 27, 1987.

* cited by examiner

PATTERN GENERATING SYSTEMS

BACKGROUND OF INVENTION (1) Field of the Invention

The present invention relates to systems for generating high-resolution optical patterns. In particular, the present invention relates to systems that incorporate Zone Plate Modulators or array of Zone Plate Modulators for generating high-resolution patterns.

(2) Brief Description of Prior Art

Optical pattern or image generating systems are widely used in many industries. For example, in the semiconductor industry high-resolution lithographic systems are used for fabricating photomasks and for direct exposing photoresist coated wafers (maskless lithography). In commercial printing press, high-resolution printing systems are used for generating offset plates. In the rapid prototyping industry, high-resolution stereo lithography or three-dimensional (3-D) lithography is employed for making various 3-D objects. High-resolution, large area projection displays are also becoming the choice for technical presentations and for home entertainment. In recent years, various techniques have been developed to meet the growing demands for both achieving higher image resolutions and increasing the throughput of image generations. For example, multiple scanning laser beams are used by both Applied Materials Inc., CA, USA, and Micronic Laser Systems AB, Sweden, to improve the throughput of their photomask fabrication systems. The most recent advancement in this field is the proposed high-speed high-resolution pattern generating systems employing spot array generators.

In general, a spot array generator is capable of generating an image or a pattern having a large field of view and maintaining a high-resolution at the same time by using a massive amount (for example, one million) of light spots and by modulating the intensities of these light spots simultaneously. As the design data are fed to the spot array generator, the intensities of individual light spots are modulated accordingly. In combination with a scanning stage, a complete large-field high-resolution optical pattern can be generated very quickly.

Shown in FIG. 1 is an illustrative schematic of a conventional high-resolution pattern generating system 100 incorporating a spot array generator 128. A collimated light beam 102 is generated by a light source 104 and a collimating lens 106. The collimated light beam 102 is transformed into an array of beamlets 108 by a spatial light modulator (SLM) 110. The beamlets 108 in turn are focused down to an array of light spots 112 (often referred to as a spot array) on the focal plane 116 of a microlens array 114. Finally, the light spots 112 are projected on to an imaging surface 118 by a first imaging lens 120. The imaging surface 118 may include a layer of photoresist such as would be required in maskless photolithography, or a layer of photoconductive material such as would be required in optical printing. The imaging surface 118 can also be a projection screen as would be required for a projection display application.

Usually, the light spots 112 in a spot array are separated by spaces. To form a complete pattern or image, the spaces between the light spots 112 in the spot array are filled in with pattern data by scanning the imaging surface 118. The scanning motion is synchronized with the pattern data fed to the spatial light modulator 110 by a computer system 122. Additional components such as a second imaging lens 124 or an aperture/aperture array 126 may be needed in certain configurations in order to properly align the SLM 110 with the microlens array 114, and to reduce cross talks between light spots. A spot array generator 128 in conventional art usually includes the spatial light modulator 110, the second imaging lens 124, the aperture array 126, and the microlens array 114.

Conventional spot array generators rely on a complicated arrangement of a number of discrete components including a microlens array, a spatial light modulator, imaging lens systems and possibly apertures or aperture arrays, where the microlens array can be either diffractive or refractive. Precision alignment between these components is critical in order for the system to function properly. Due to the discrete nature of the critical components used in the conventional art, these high-resolution pattern generating systems all suffer from the problems of being bulky, being susceptible to environmental influences such as temperature change and mechanical vibrations, and having higher system costs.

There are many other problems that relate to the specific system designs. Kenneth C. Johnson (U.S. Pat. No. 6,133,986, filed on Feb. 20, 1997, issued on Oct. 17, 2000) proposed a maskless microlens lithography system, a version of high-resolution pattern generating system that incorporates a refractive microlens array. However, refractive microlens arrays are the miniature version of 3-D lenses. Larger arrays of microlenses including, for example, one million of lenslets, and having uniform lens properties are very difficult and expensive to fabricate, and are not suited for large-scale manufacturing.

Henry Smith (U.S. Pat. No. 5,900,637, filed on May 30, 1997, issued on May 4, 1999) proposed a maskless lithographic system that used an array of static Fresnel zone plates as the microlens array. However, the operating speed of this type of high-resolution pattern generating system is limited by the SLM. A demonstration system (Ihsan Djomehri, et al., *J. Vac. Sci. Technol.* B(16), p 3426(1998)) used a combination of an array of zone plates and a Digital Light Processor (DLP)™, a version of digital micromirror SLM array made by Texas Instrument, Texas. The performance was limited by the relative slow response time of the DLP.

Later, another demonstration system (Dario Gil, et al., *J. Vac. Sci. Technol.* B(20), p 2597(2002)) showed an improved response time by replacing the DLP with a Grating Light Valve (GLV) array (Silicon Light Machines, CA) as the SLM to modulate the beamlets at each zone plate lens. However, this type of spot array generators is not suited for directly generating two-dimensional (2-D) images due to the fact that the GLV is essentially an one-dimensional (1-D) linear SLM and can not be configured into a high-density 2-D array. To form a 2-D pattern, precision mechanical scanning in the direction normal to the linear array across the whole field of the image has to be used, as the system proposed by U.S. Pat. No. 5,982,553, filed on Mar. 20, 1997, issued on Nov. 9, 1999.

The MAPPER design by Mapper Lithography B. V., Netherlands (PCT Pub. No. W003/079116, filed on Mar. 19, 2003, published on Sep. 25, 2003) used a combination of a refractive microlens array and a switched optical fiber bundle. This type of system is extremely complex and bulky when the number of lens elements becomes large.

It is desirable to have a pattern generating system that is very compact in size, easy to make, and capable of delivering reliable performance under normal environmental conditions. It is also desirable to have a pattern generating system that can generate a 2-D pattern directly and can operate at high speed with high bandwidth.

(3) Objects and Advantages

Accordingly, it is the object of the present invention to provide advanced pattern generating systems that have a greatly simplified system design resulting in reduced system size, improved system performance and reliability.

It is another object of the present invention to provide pattern generating systems that can generate large-field high-resolution patterns with increased speed and throughput for patterning 2-D or 3-D objects.

Yet, another object of the present invention is to provide pattern generating systems compatible with a wide range of illumination sources.

Further objects and advantages of the present invention will become apparent from the following detailed description taken in conjunction with the accompanying drawings, illustrating, by way of examples, the principles of the invention.

SUMMARY OF INVENTION

The present invention relates to pattern generating systems. In particular, the present invention relates to pattern generating systems incorporating Zone Plate Modulator (ZPM) arrays to create 2-D images on a surface or to pattern 3-D objects.

A ZPM array comprises diffractive zone plate modulating elements that are capable of either diffracting or reflecting waves incident upon the ZPM elements. The intensities of either the diffracted or the reflected waves can be modulated according to the pattern data sent to the ZPM array through an electronic control circuitry. Either the diffracted waves or the reflected waves can be used to represent the pattern data by properly collecting the respective waves and modulating the ZPM elements cooperatively. Further, the diffracted waves form an array of wave spots on the primary focal plane of the ZPM array.

When used as spot generators, ZPM arrays provide the functions of both a modulator and a focusing lens, eliminating several large components as would be required in conventional art. The integrated approach taken by the ZPM offers substantial improvements in reducing system complexity, improving reliability and stability, in addition to the intrinsic advantages of compactness, high operating speed, and high bandwidth. Accordingly, pattern generating systems incorporating ZPM arrays provide many improvements over prior art such as simplified system design, reduced system size, less maintenance, improved reliability and stability, and increased throughput.

The pattern generating systems in accordance with the present invention are separated into two categories based on how the fundamental image pixels on the generated images are formed.

According to one aspect, the present invention provides a large-field high-resolution pattern generating system, in which ZPM arrays are used as spot array generators. For this type of applications, wave spots in a spot array on the primary focal plane of the ZPM arrays are used as the fundamental image pixels. The imaging optical system, arranged in a dark field configuration, images the spot array onto the imaging surface with a predetermined magnification. A complete large-field high-resolution image is formed by filling in the spaces between wave spots through a subfield scanning means. Further more, the ZPM arrays can be arranged as part of a scanning confocal microscopy subsystem in the large-field high-resolution pattern generating systems for imaging and alignment purposes.

According to another aspect, the present invention provides a direct pattern generating system, in which the ZPM elements in a ZPM array are used as the fundamental image pixels directly. The imaging optical system, arranged in either a dark field or a bright field configuration, images the front surface of the ZPM arrays onto the imaging surface.

The pattern generating systems in accordance with the present invention generally includes: a) an illumination system for providing illumination waves to the ZPM arrays, b) one or more ZPM arrays for processing or modulating the illumination waves according to image data, c) an imaging optical system for imaging the modulated waves onto an imaging surface, d) an imaging surface to receive the modulated waves, and e) optionally a scanning means for scanning the modulated waves across the imaging surface.

The illumination system may comprise one or more wave sources, reflectors, mirrors, dichroic mirrors, and lens assemblies for collimating and converging the illumination waves. The illumination system generates and collimates illumination waves, and causes the illumination waves to impinge on the ZPM arrays at a predetermined angle. The illumination system may generate monochromatic waves such as visible light, UV radiation, extreme UV radiation or x-ray radiation. Further the illumination system may generate waves of more than one dominant wavelengths, such as red, green and blue (RGB) colors, for use in color displays. Three separate light sources can also be used to generate the RGB colored illumination light waves. A white light source with appropriate dichroic mirrors is another way to generate RGB colored light waves.

The imaging optical system may comprise one or more lens assemblies and provides an image on an imaging surface from the ZPM arrays with a predetermined magnification. The image on the imaging surface can be a magnified image if the magnification is larger than unity for applications such as projection displays or direct viewing systems. The image on the imaging surface can be a demagnified image if the magnification is smaller than unity for applications such as high-resolution maskless lithography. The imaging optical system may further comprise zeroth-order stops and/or higher-order aperture stops to separate the diffracted light waves from the undiffracted or reflected waves. The imaging optical system allows one type of the waves (diffracted or undiffracted) to reach the imaging surface while blocks the other type of waves. The image optical system may further comprise relay lens assemblies relaying the intermediate image generated by the imaging lens assembly onto the imaging surface or object.

The ZPM arrays can be 1-D, 2-D, or staggered 2-D ZPM arrays. A 2-D pattern can be generated using a 2-D ZPM array directly. A 2-D pattern can also be generated by using a 1-D ZPM array to form a line pattern, and by scanning the line pattern in the direction normal to the line pattern through a scanning means. Further, a 2-D pattern can be generated by using a staggered 2-D ZPM array to form a dense linear pattern, and by scanning the dense linear pattern in the direction normal to the dense linear pattern through a scanning means. To generate a color image, one or more (such as three) ZPM arrays can be used in high performance display systems.

An imaging surface is provided for receiving the image or pattern formed by the imaging lens system. The imaging surface is a projection screen as would be required for a projection display, a layer of photoconductive material as would be required for an optical printer, an optical recording medium as would be required for an optical data storage system, or a layer of wave sensitive materials (such as photoresist/photopolymers for photolithography) as would be required for a (2-D or 3-D) photolithography apparatus. The imaging surface may further be a surface that needs to be modified by the modulated waves as would be used for surface modification, surface treatment, or imprinting applications. Further, the imaging surface may not be needed at all as would be for direct viewing systems where the image is a virtual image and is viewed directly by an observer.

DETAILED DESCRIPTION OF THE INVENTION

The pattern generating systems disclosed here in accordance with the present invention include a particularly preferred wave modulating device—a Zone Plate Modulator or a Zone Plate Modulator array. The terminology. "Zone Plate Modulator" or ZPM for short, adopted in this disclosure, refers to a wave modulating device comprising a pair of complementary zone plates and a modulation means for modulating the optical path difference between the two zone plates. Accordingly, the terminology "Zone Plate Modulator array" or ZPM array refers to a device comprising a plurality of ZPM elements and preferably having the ZPM elements arranged into a regular pattern such as a 1-D array or a 2-D array with individual ZPM placed on a square grid. Each ZPM element in a ZPM array operates independently according to the control signal.

The principles of ZPMs are described in detail in U.S. patent application Ser. No. 10/707,257, filed by the same applicant of the present invention, the disclosure of which is hereby incorporated by reference in its entirety. The unique feature of a ZPM is that it is a modulator and also a focusing lens. It can both modulate an incoming wave and focus the incoming wave into a point in a single integrated device. In addition, ZPMs can be designed as microelectro-mechanical devices and be manufactured using the mature CMOS compatible fabrication technology. They are compact and lightweight, and operate with sub-microsecond response time and high bandwidth. In particular, ZPM arrays can be used as compact spot array generators for generating large-field high-resolution patterns with superior performances and reliability.

Figure 1:
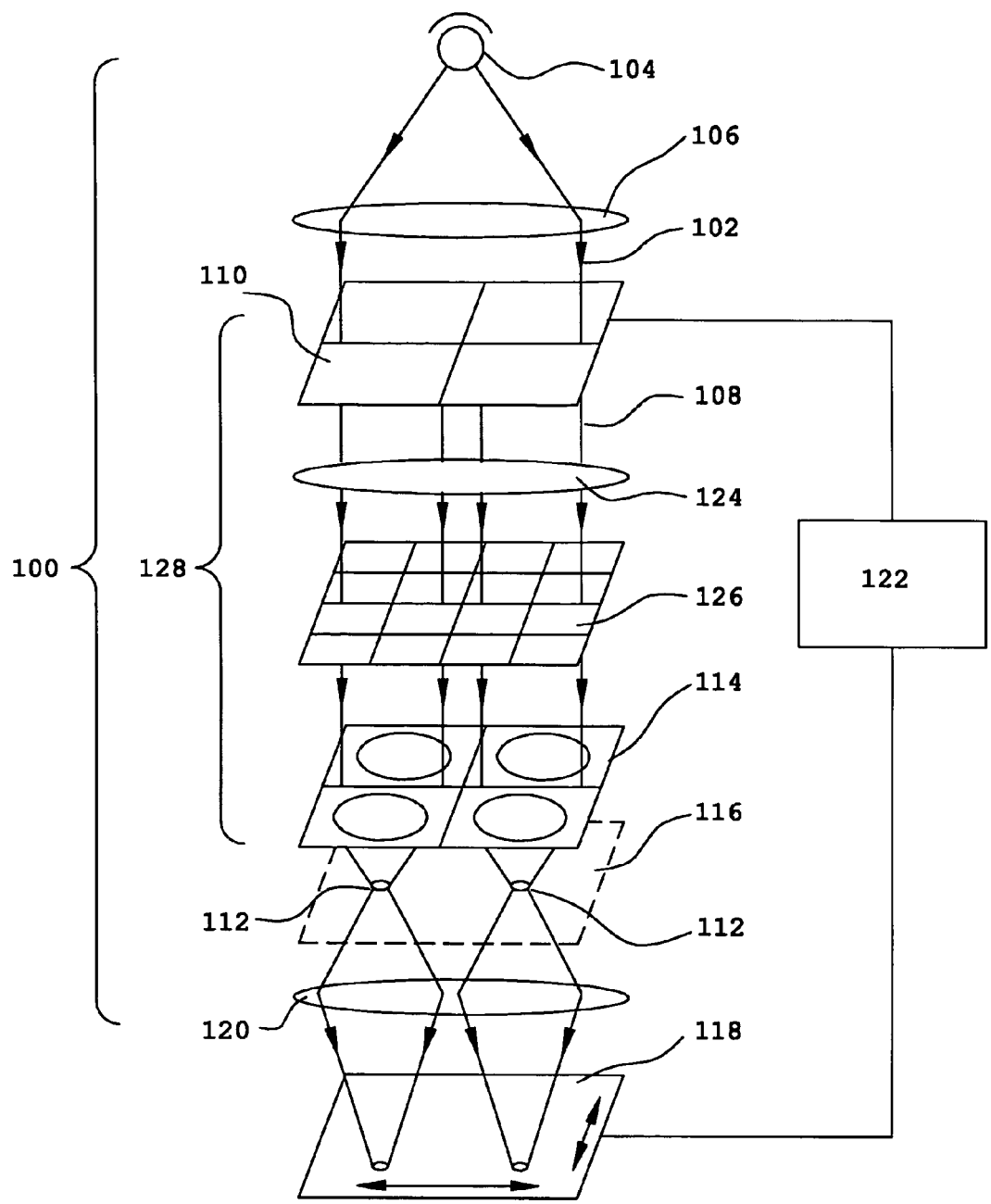
FIG. 1 is a schematic representation of a pattern generating system in prior art incorporating a conventional spot array generator.
Figure 2A:
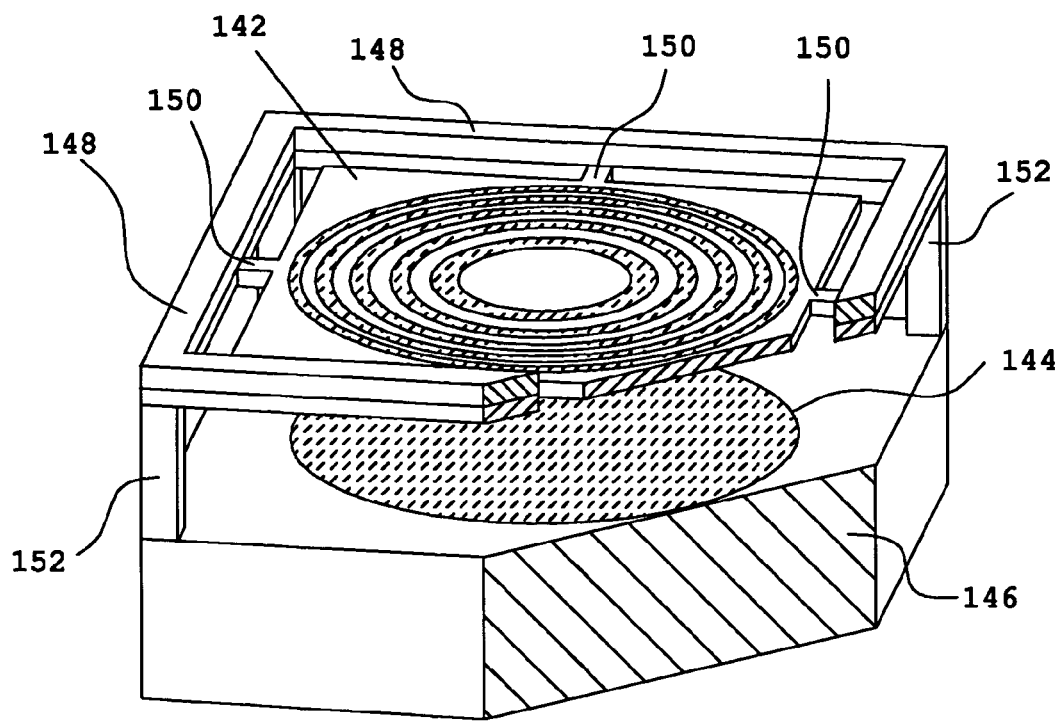
FIG. 2a is a perspective view of one example of a prior art micromachined Zone Plate Modulator (ZPM) suitable for use in a pattern generating systems in accordance with the present invention.
Figure 2B:
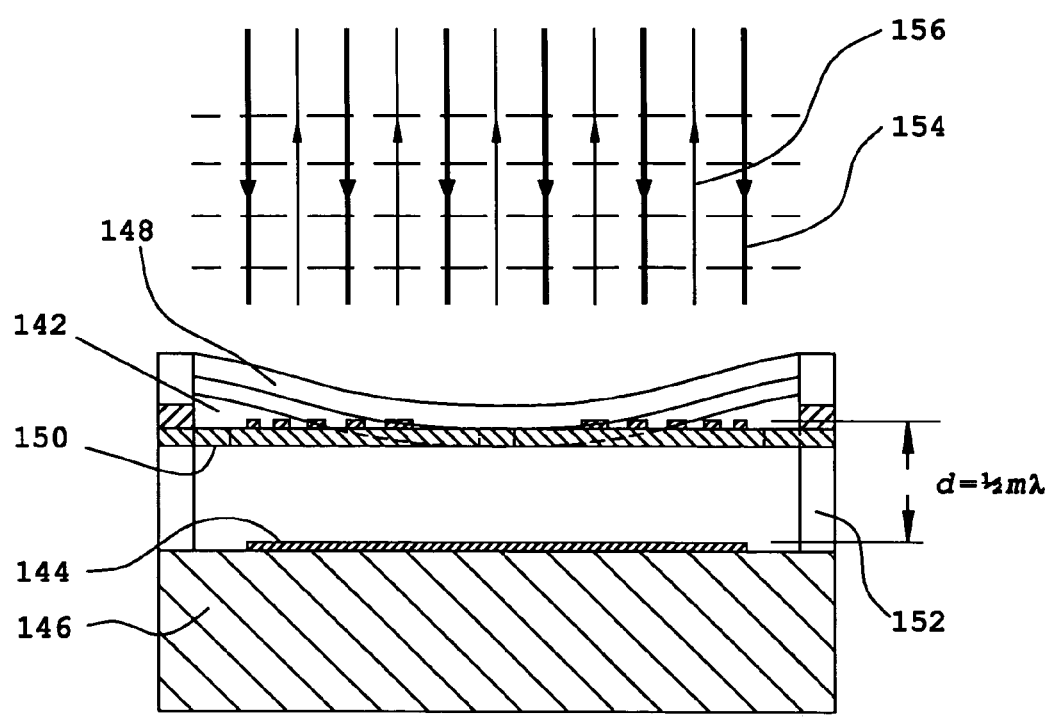
FIG. 2b is a cross-sectional view schematically illustrating an operational state of the ZPM in FIG. 2a wherein the ZPM behaves like a mirror.
Figure 2C:
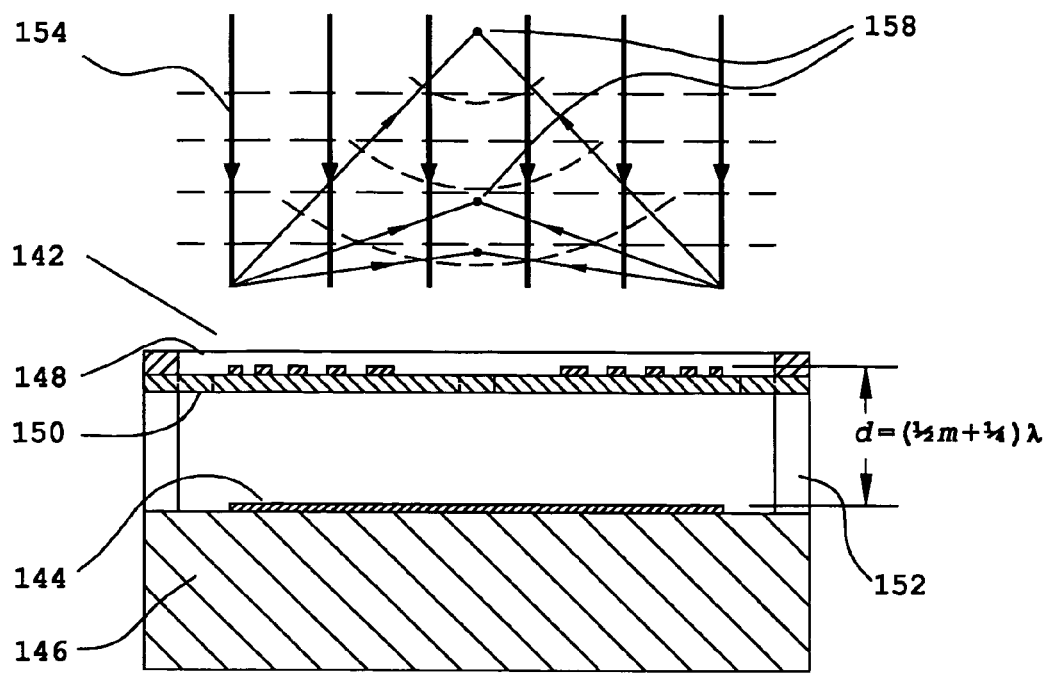
FIG. 2c is a cross-sectional view schematically illustrating an operational state of the ZPM in FIG. 2a wherein the ZPM behaves like a phase zone plate and focuses the illumination waves into a series of focal points along the optical axis of the ZPM.

The construction and operation of ZPMs are briefly described here with references to FIG. 2a, FIG. 2b, and FIG. 2c. Shown in FIG. 2a is the perspective view of a ZPM. A ZPM comprises a pair of complementary reflective zone plates 142 and 144, which form a complete reflecting mirror when they are superimposed together at their centers. For simplicity, the second zone plate 144 is replaced by a mirror. Since the waves reaching the mirror 144 is delineated by the transparent zones of the first zone plate 142, the first zone plate 142 and the mirror 144 therefore automatically form a pair of self-centered complementary zone plates.

Normally, one of the zone plates is a movable plate. For the embodiment of the ZPM shown in FIG. 2a, FIG. 2b, and FIG. 2c, the first zone plate 142 is the movable plate. The first zone plate 142 is suspended above a substrate 146 by resilient beams 148 through linkages 150 and supporting posts 152, and is substantially parallel with the second zone plate 144. When a force is applied to the first zone plate 142 in a direction normal to the zone plate, the first zone plate 142 is deflected with respect to the second zone plate 144 by deforming the resilient beams 148. The first zone plate 142 itself remains substantially flat, and therefore stays parallel to the second zone plate 144 in the deflected state.

Figure 3:
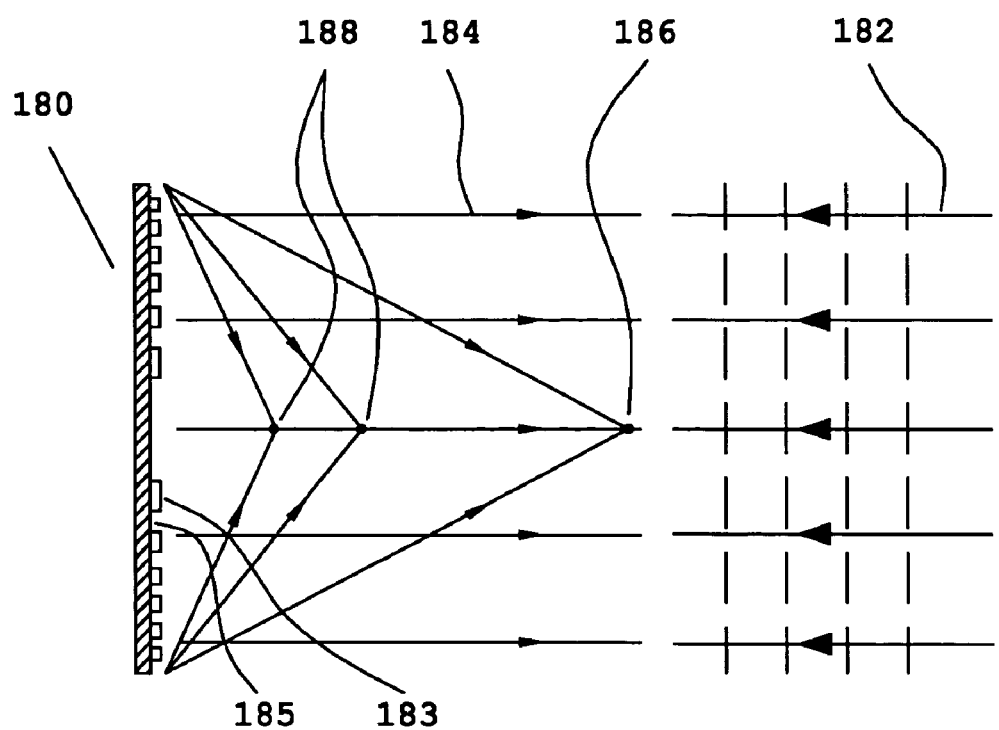
FIG. 3 shows the output distributions of a single conventional reflective zone plate, wherein the outputs consist of a substantial portion (~25%) of plane waves (undiffracted waves) and a series of diffracted waves forming the focal points along the axis of the zone plate.

To facilitate the explanation of ZPM's operation, first consider a single reflective zone plate 180, as shown in FIG. 3, under the illumination of a plane wavefront 182. The reflective zone plate 180 has alternating wave reflecting zones 183 and wave absorbing zones 185. As a direct result of the Huygens-Fresnel principle and wave interference, the zone plate creates a series of diffracted waves forming the focal points 186 & 188 (referred to as focusing waves) along the axis of the zone plate, and also a substantial portion (~25%) of plane waves 184 (referred to as reflected or undiffracted waves).

Another way to look at the waves created by the zone plate is to categorize the waves into the zeroth-order diffracted waves 184 (which are referred to as reflected or undiffracted waves), the first-order diffracted waves 186 (the part of the focusing waves that form the real primary focal point), and higher-order diffracted waves 188 (the remaining part of the focusing waves forming all other real and virtual focal points). Diffracted waves higher than the 3rd order, plus all virtual focal points, are not shown in FIG. 3 for clarity.

Now referring to the cross-sectional view of a ZPM as shown in FIG. 2b in a first configuration. The distance between the first zone plate 142 and the second zone plate 144 is $m\lambda/2$, where m is an integer, $\lambda$ is the wavelength of the illumination wave, the reflected waves from the two zone plates interfere constructively. The modulator reflects the illuminating plane wavefront 154 as plane waves 156 just like a mirror. Whereas the focusing waves interfere destructively, canceling out each other. In a second configuration as shown in FIG. 2c where the distance between the first zone plate 142 and the second zone plate 144 is $(m/2+\frac{1}{4})\lambda$, the focusing waves from the two zone plates interfere constructively. The modulator focuses the illuminating plane wavefront 154 into a series of focal points 158 just like a reflective phase zone plate. Whereas, the reflected waves from the two zone plates interfere destructively and cancel out each other. In any other configurations, the output from a ZPM is a mixture of reflected and focusing waves. To achieve complete cancellation and high contrast ratio, the amplitudes of the waves from the two zone plates should be substantially equal. Therefore, the total reflective surface areas of the first and the second zone plates should be substantially equal, assuming that these reflecting surfaces have similar reflectance.

The force used to deflect the movable zone plate, which is the first zone plate 142 as shown in FIG. 2a, FIG. 2b, and FIG. 2c, can be any forces produced by effects including electrostatic, electromagnetic, magnetic, magnetostrictive, piezoelectric, and thermal effects. For example, electrically conductive layers can be incorporated into the first and the second zone plates of a ZPM. The two conductive layers form a pair of electrodes of a parallel plate capacitor. When an appropriate voltage is applied between the two electrodes, an electrostatic force is generated by the applied voltage and is able to deflect the movable plate. One of the great advantages of the ZPM is that the force required to achieve a full modulation is very small since the deflection for achieving a full modulation is only ¼ of the wavelength of the illumination wave source. For example, the deflection for achieving a full modulation is only 48.3 nm for a ZPM designed for use with an ArF laser source having a wavelength of 193 nm.

The ways a ZPM can be used in an optical system are very flexible. First of all, either the reflected waves or the focusing waves can be selected to represent the pattern data by using appropriate apertures or stops. Secondly, a ZPM can also operate either in a digital mode or in an analog mode. In the digital (or binary) mode, a ZPM operates either at the first configuration or the second configuration by applying an appropriate digital control signal to the ZPM. In the analog mode, on the other hand, the distance between the first and the second zone plates of a ZPM is changed continuously by applying an analog control signal to the ZPM. Further more, since the principle of ZPMs is based on wave interference, a ZPM can be used to modulate any type of waves including electromagnetic radiation (infrared light, visible light, ultra violet light, deep ultra violet light, extreme ultra violet light, X-rays), matter waves and acoustic waves. Matter waves include charged particle beams such as electron beams or ion beams. Even though most of the examples of pattern generating systems illustrated in this disclosure are described based on light waves, it should not be considered as limitations to the present invention.

As disclosed in U.S. patent application Ser. No. 10/707,257, it is possible to configure the two zone plates in a ZPM in a number of different ways in order to adapt to various requirements of different applications. For example, a ZPM may have a square aperture, instead of a circular aperture, to increase its fill factor, therefore the optical efficiency. The optical and mechanical properties of a ZPM can also be tailored easily to meet specific needs. Consider a typical ZPM for microlithographic application. The ZPM is 50 micrometers×50 micrometers in size and has a primary focal length of 50 micrometers. Such a ZPM has a Rayleigh resolution of 0.53 micrometer for a light source having a wavelength of 436 nm. For X-ray lithographic applications, a ZPM that is 10 micrometers×10 micrometers in size and has a primary focal length of 30 micrometers can produce a diffracted limited spot of 33 nm in diameter for a X-ray source having a wavelength of 4.5 nm.

Arrays comprising a plurality of ZPM elements arranged in a regular form are of particular importance. A ZPM array can be used as a spot array generator. When a ZPM array is illuminated with a collimated wave, an array of diffraction limited spots is formed on the focal plane of the ZPM array. In turn, the spots in the spot array can be used as the fundamental image pixels for generating large-field high-resolution patterns. Further, each element in a ZPM array can be used directly to form fundamental image pixels. Accordingly patterns with the same number of pixel elements as the ZPM array can be generated.

The ZPM elements in a ZPM array can be arranged as an 1-D array, a staggered 2-D array, or a regular 2-D array. In 2-D arrays, the ZPM elements can be placed on a rectangle grid, on a hexagonal grid or on any other regular grids. A 2-D high-resolution pattern can be produced using a 2-D ZPM array in conjunction with a subfield scanning means to fill in the spaces between spots. A 2-D pattern can also be generated by using a 1-D ZPM array or a staggered 2-D ZPM array in conjunction with a mechanical scanning means to scan in a direction normal to the ZPM array. A staggered 2-D ZPM array, in which each row of ZPMs is shifted by a small amount with respect to the neighboring rows, can be used as a 1-D array that has a much higher linear spot density.

Since the fundamental image pixels that are used to form the final pattern or image on an imaging surface depends on how the ZPM arrays are used, accordingly, the pattern generating systems incorporating ZPM arrays are categorized as large-field either high-resolution pattern generating systems or direct pattern generating systems, which are disclosed in detail in the separate sections below.

I. Large-field high-resolution pattern generating systems incorporating ZPM arrays In the field of optical imaging art, the term "dark field" image, also known as Schlieren image, refers to an image produced by collecting scattered or diffracted waves. The term "bright field" image, on the other hand, refers to an image that is formed by collecting either reflected or transmitted waves.

When a ZPM is at the second configuration, the ZPM behaves like a phase zone plate. The first-order diffracted waves carry substantial amount (~41%) energy of the incoming illumination, and also form a diffraction limited light spot at the real primary focal point of the ZPM when the illumination waves are plane waves. Since all the ZPM elements in the ZPM array are designed and fabricated with similar parameters, the real primary focal points from all the ZPM elements in a ZPM array constitute a spot array on the real primary focal plane of the ZPM array.

In a large-field high-resolution pattern generating system in accordance with the present invention, ZPM arrays are used as spot array generators. Accordingly, the first order diffracted waves from the ZPM arrays are collected by arranging the imaging optics in a dark field configuration. It should be noted that the virtual primary focal points of a ZPM array work equally well for the on-going discussions. Also for clarity, only the zeroth- and the first-order diffracted waves are shown on the accompany drawings.

The unique feature of a spot array generator is that it can generate a large field image while maintaining high resolution. When a spot array is statically imaged on to a surface, the image is simply an array of regularly spaced light spots replicating the arrangement of the light spots in the spot array. To form a complete image, the spaces, referred to as subfields, between the light spots on the imaging surface are filled with corresponding sub-patterns/images by a process called subfield scanning.

Figure 4:
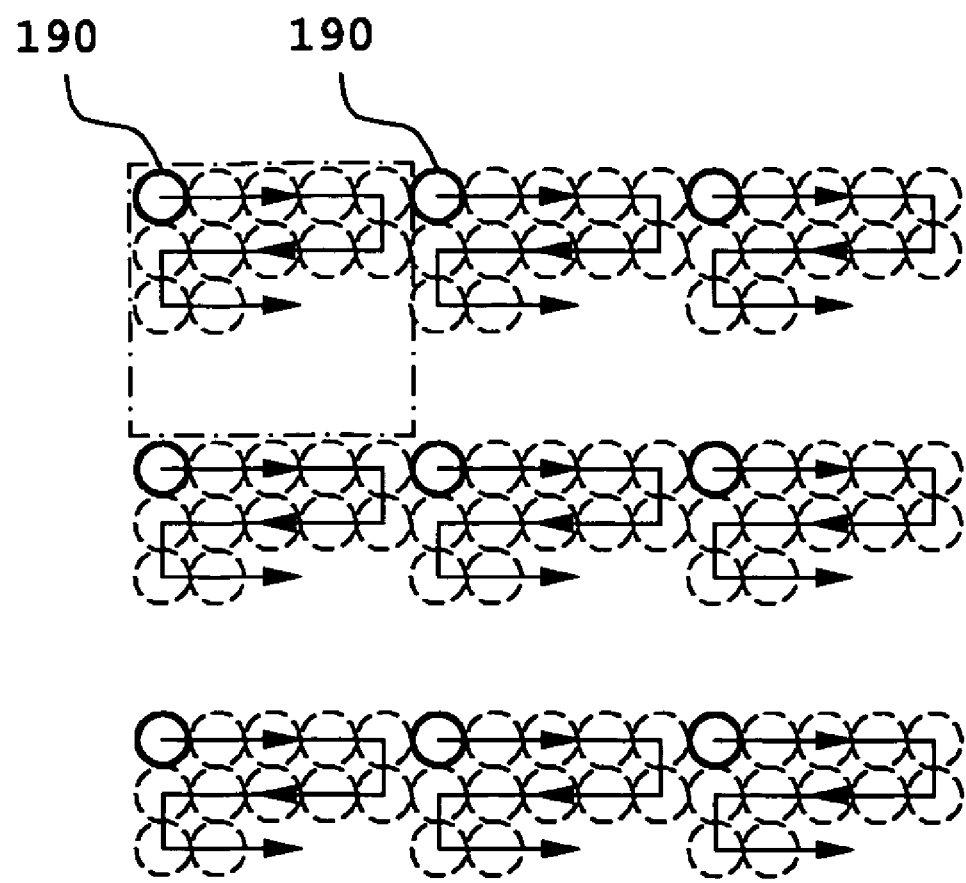
FIG. 4 illustrates the principle of subfield scanning in accordance with the present invention for filling in the spaces between the spots created by a spot array generator. Full circles represent the starting position of the subfield scanning sequence. The dash-dot box outlines a subfield.

One way that a subfield scanning process can be carried out is to scan the light spots in a serpentine fashion. First, a user designed pattern/image is fractured into individual frames or frame data by a computer system. Then the frame data are used to modulate the intensities of individual light spots frame-by-frame during the scanning process. Shown in FIG. 4 is a portion of an image generated by a spot array generator. The full circles 190 symbolize the starting position (the first frame) of the light spots on an imaging surface. The dash-dot box outlines one subfield area. During the subfield scanning, all the spots move simultaneously one step at a time horizontally until a line is completed. Then the light spots step down a row and start scanning another line in the reverse direction of the previous line. This process continues until the subfield area is filled. The intensities of the light spots are modulated according to the frame data synchronously with the stepping during the scanning process.

The step size in FIG. 4 is set to equal to the size of the light spots. A step size smaller than the spot size can be used to cause the spots to partially overlap, therefore producing patterns with smoother edges and more uniformed exposure on the imaging surface. Those familiar with the art to which the present invention pertains will recognize that there are many ways and sequences to fill a subfield area with frame data. The particular step size and scanning sequence shown in FIG. 4 are for purpose of illustrating the principle of subfield scanning, and should not be considered as limitations.

Since all the light spots on the imaging surface are scanned simultaneously and are displaced by a same distance, therefore, a single subfield scan fills in the entire spaces around all the light spots, producing a complete image that has both the extent of the spot array and the resolution of individual light spots (both are adjusted by the magnification of the imaging lens system). This completed image, referred to as a "field image", is a large-field high-resolution image. As an example, considering a 2-D ZPM array having 1000×1000 ZPM elements. Each ZPM element is 50 micrometers×50 micrometers in size and has a focal length of 50 micrometers. Such a ZPM array is capable of generating a spot array with each spot having a diffracted limited diameter of about 1 micrometer for an illumination source having a wavelength of 436 nm. To fill in the subfields, all the spots in the spot array are scanned across the subfield area, which is 50 micrometers×50 micrometers, with a step size of 1 micrometer in both x and y directions. Consequently a field image of 50 mm×50 mm in size and having a pixel size of 1 micrometer is formed, assuming that the spot array is imaged onto the imaging surface with a unit magnification. The total number of pixels in this high-resolution field image is 2500 millions.

Another advantage of using the subfield scanning technique for generating large-field high-resolution patterns is that the scan range is very small. Therefore, superior scanning linearity and precision can be easily achieved. Continuing above example. Since the scan range is only 50 micrometers in the linear dimension, therefore only 50 steps, with a step size of 1 micrometer, are needed to fill in the spaces between the neighboring light spots in the linear dimension. In comparison, a whole field scanning would require 50,000 step, which requires a very sophisticated scanning system in order to achieve good linearity and accuracy.

A superfield image is an image larger than the field image. A superfield image can be generated by stitching a number of field images together.

The large-field high-resolution pattern generating systems disclosed here in accordance with the present invention can be configured for various high-resolution applications including 2-D/3-D maskless lithographic system, optical printing system, optical recording system, projection display system, direct viewing system, and systems for surface modification/treatment/imprinting.

Figure 5:
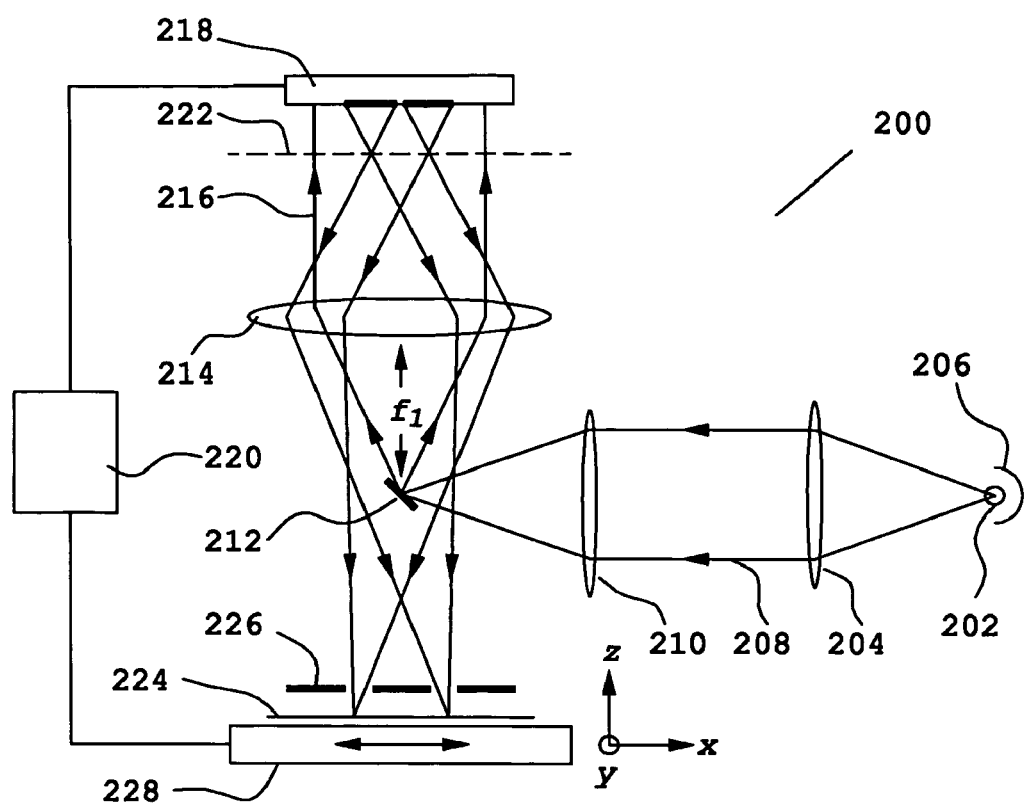
FIG. 5 is a general schematic representation of one preferred embodiment of a large-field high-resolution pattern generating system comprising a ZPM array in accordance with the present invention.

Now referring to FIG. 5, the preferred embodiment of a large-field high-resolution pattern generating system 200 in accordance with the present invention is illustrated. The light waves generated by a light source 202 are collimated by a collimating lens assembly 204. Appropriate light sources include lasers, solid state lasers, LEDs, short arc (mercury/xenon) lamps, radiation from laser produced plasma (LPP) sources, radiation from high-order harmonic generation (HHG) in argon plasma source, and radiation from synchrotrons. For light sources such as short arc lamps that radiate in all directions, a reflector 206 is placed behind the light source 202 to increase the collecting efficiency of the light source. The collimated light waves 208 converge onto a folding mirror 212 by a lens assembly 210. The folding mirror 212, having a predetermined size, is placed at a distance from an imaging lens assembly 214 of about a focal length (f1) of the imaging lens assembly. The surface of the mirror 212 is inclined at a 45 degree angle to the optical axis of the imaging lens assembly 214. The folding mirror 212 rotates the propagation direction of the illuminating light waves by 90 degrees towards the ZPM array 218.

Reflector 206, lens assemblies 204 and 210, and the folding mirror 212 constitute a light collection assembly for collecting the light output from the light source 202 and directing the light waves to the ZPM array 218. Multiple collection assemblies can be arranged to collect the light output from several directions around the light source 202 to increase the collecting efficiency. The method and use of multiple collection systems to increase the collecting efficiency of a light source is described in detail by U.S. Pat. No. 5,629,801, issued on May 13, 1997 to Bryan P. Staker, et al.

The light waves leaving the folding mirror 212 are re-collimated by the imaging lens assembly 214 as plane waves 216, and illuminate a 2-D ZPM array 218 at the normal direction of the array. For clarity, only two representative ZPM elements are shown on the ZPM array. The 45 degree inclination angle of the folding mirror 212 is chosen here for convenience of the illustration and should not be considered as limitation.

It will be apparent to those of ordinary skills in the optical art that the collimating lens assembly 204 can be one or more of lens elements which may be spherical, aspherical, or cylindrical in order to properly correct any astigmation and collimate the light waves generated by the selected light source. The imaging lens assemblies 210 and 214 are used for the purpose of imaging and collimating, and are intended to represent groups of one or more lens elements that can be spherical lenses, aspherical lenses, gradient Index lenses (such as Gradium(R) lenses, LightPath Technologies Inc., Florida, USA) or cylindrical lenses. Further more, the lens elements can be refractive, diffractive, or reflective. Reflective mirrors, also called focusing mirrors, have been used extensively to replace refractive lenses in astronomy to reduce the weight of lenses and in extreme UV optical systems owing to their high optical efficiency in the shorter wavelength region.

The ZPM array 218 spatially modulates the illuminating plane waves 216 according to the frame data coming from a microprocessor-based electronic control circuitry 220. As mentioned previously, the waves diffracted by a ZPM array consist of various orders of diffractions. The first-order diffraction forms a spot array on the primary focal plane 222 of the ZPM array 218. It is this spot array that the imaging lens assembly 214 images onto an imaging surface 224 with a predetermined magnification. The image surface 224 is positioned at the conjugate plane of the primary focal plane 222 of the ZPM array 218. The field size of the image formed on the imaging surface 224 is larger than the field size of the spot array formed on the focal plane 222 if the magnification is larger than unity. The field size of the image formed on the imaging surface 224 is smaller than the field size of the spot array formed on the focal plane 222 if the magnification is smaller than unity.

The imaging lens assembly 214, in the illumination direction, functions as part of the illumination arrangement for the ZPM array 218. In the direction of diffracted and reflected waves, the imaging lens assembly 214 functions as an imaging lens and images the spot array on the primary focal plane 222 of the ZPM array 218 onto an imaging surface 224 with a predetermined magnification.

A zeroth-order stop 212, placed at a distance from the imaging lens assembly 214 of about a focal length (f1) of the imaging lens assembly, blocks the zeroth-order diffracted waves while allows other orders of diffracted waves to pass by. A high-order aperture stop 226, which is placed close to, and in front of the image surface 224, blocks higher, except the first, order diffractions. The zeroth-order stop 212, the higher-order aperture stop 226, and the imaging lens assembly 214 constitute a band-pass filter, and allow only the first-order diffracted waves to reach the imaging surface 224.

In this embodiment, the folding mirror 212 serves two purposes as a) a light folding mirror and b) a zeroth-order stop. The mirror 212 is oriented in such a way that it directs the illumination wave to the ZPM array in a proper angle. It also reflects the zeroth-order diffracted waves back to the illumination arrangement. Essentially, it prevents the zeroth-order diffracted waves from propagating to the imaging surface 224, allowing only non-zeroth-order diffracted waves to pass by. The imaging lens assembly 214, and the mirror/stop 212 form a telecentric Schlieren optical system. Alternatively, a dedicated mirror and a dedicated zeroth-order stop can be used. The zeroth order stop can be either absorbing or reflecting.

Finally, an array of light spots, consisting of only the first-order diffracted waves and being modulated by the frame data, is formed on the imaging surface 224 by the imaging lens assembly 214. It is well known in the optical art that lenses with higher numerical aperture have better resolution and higher optical collecting efficiency. It is therefore preferable to have an imaging lens assembly 214 that has a numerical aperture larger than that of the ZPM elements in the ZPM array 218.

The imaging surface 224 comprises light sensitive materials, of which one or more characteristics are changed after being exposed to the light spots. For an optical data storage and retrieval applications, the imaging surface is an optical recording medium. For an optical printer, the imaging surface is a light sensitive solid state material such as photoconductive material. For maskless photolithography (or direct writing) applications, the imaging surface is, in general, a wafer layered with wave sensitive materials such as photoresists or electron beam resists. For stereolithography applications, the imaging surface is photopolymers or photomodifiable materials.

The imaging surface 224 can also be a surface of materials to be modified by the light spots such as in direct surface treatment, modification, carving, and imprinting. The imaging surface can further be a screen as required to provide a projection display to viewers. Lastly, but not exhaustively, the imaging surface can be eliminated as would be the case for direct viewing applications where a virtual image is formed on the retina of an observer.

A movable x-y-z stage (also called alignment fixture) 228 is provided for holding the imaging surface 224, and also for positioning and aligning the imaging surface in x-y-z dimensions.

A complete field image is generated by filling the spaces between the light spots using a subfield scanning means. In particular, the subfield scanning means is to move the movable stage 228 along the x-y plane to produce a complete field image. The process of subfield scanning is synchronized with the frame data sent to the ZPM array 218 by the control circuitry 220. Superfield images can be generated by moving the stage 228 by a distance substantially equal to the size of the field image after each field image is generated.

Without the high-order aperture stop 226, waves from higher-order diffractions form a background illumination around the light spots on the imaging surface. This background illumination is acceptable for certain applications. Accordingly, the large-field high-resolution pattern generating system shown in FIG. 5 can be simplified by omitting the high-order aperture stop 226 for these type of applications. For example, the thermalset photoresists disclosed by U.S. Pat. Pub. No. 2003/0123040, filed on Nov. 7, 2002, published on Jul. 3, 2003, does not respond to an illumination if the illumination level falls below a threshold value. Accordingly, the high-order aperture stop 226 is not required when this type of resist materials is used.

The microprocessor-based electronic control circuitry 220, such as a computer, may contain all the calibration data including the intensity calibration and position calibration data of individual light spots in its electronic storage. The control circuitry 220 receives user defined pattern, fractures the pattern into individual frame data, applies the calibration data to the frame data, and in turn uses the corrected frame data to operate the ZPM elements in the ZPM array 218. The control circuitry also receives alignment data and uses the alignment data to position the movable stage/alignment fixture properly in x-y-z directions. The control circuitry 220 further synchronizes the position of the movable stage 228 with the frame data during the subfield scanning/superfield stitching.

Figure 6:
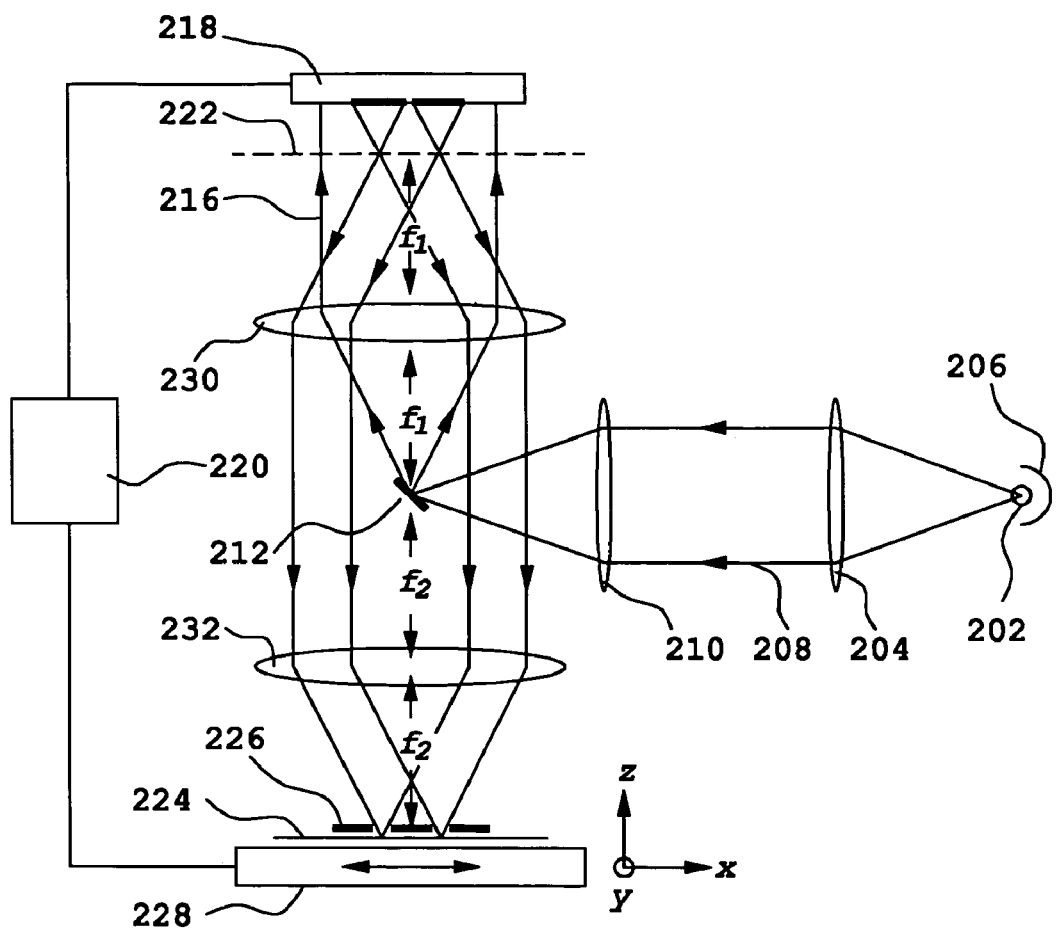
FIG. 6 is a general schematic representation of a large-field high-resolution pattern generating system of the type shown in FIG. 5 with a double Fourier lens arrangement.

FIG. 6 shows an alternative method of filtering and imaging the light spots. Instead of using a single imaging lens assembly, the method in FIG. 6 uses a pair of lens assemblies, arranged in a double Fourier lens configuration. The first Fourier lens assembly 230 is placed at a distance from the primary focal plane 222 of the ZPM array 218 of about a focal length (f1) of the first Fourier lens assembly 230. The second Fourier lens assembly 232 is placed at a distance from the first Fourier lens assembly 230 of about the sum (f1+f2) of the focal lengths of the two Fourier lens assemblies. The folding mirror/zeroth-order stop 212 is placed behind the first Fourier lens assembly 230 at a distance of about the focal length (f1) of the first Fourier lens assembly. The high-order aperture stop 226 is placed behind the second Fourier lens assembly 232 at a distance of about the focal length (f2) of the second Fourier lens assembly.

In such a configuration, The light spots on the primary focal plane 222 are relayed onto the imaging surface 224. Whereas, the zeroth-order diffracted waves are blocked by the zeroth-order stop 212. The high-order aperture stop 226 blocks high-order, except the first-order, diffracted waves from reaching the imaging surface 224. Consequently the double Fourier lens assemblies in conjunction with the zeroth-order stop 212 and the high-order aperture stop 226 produce a clean light spot array on the imaging surface 224. The high-order aperture stop can be omitted for certain applications where background illumination is acceptable.

Figure 7:
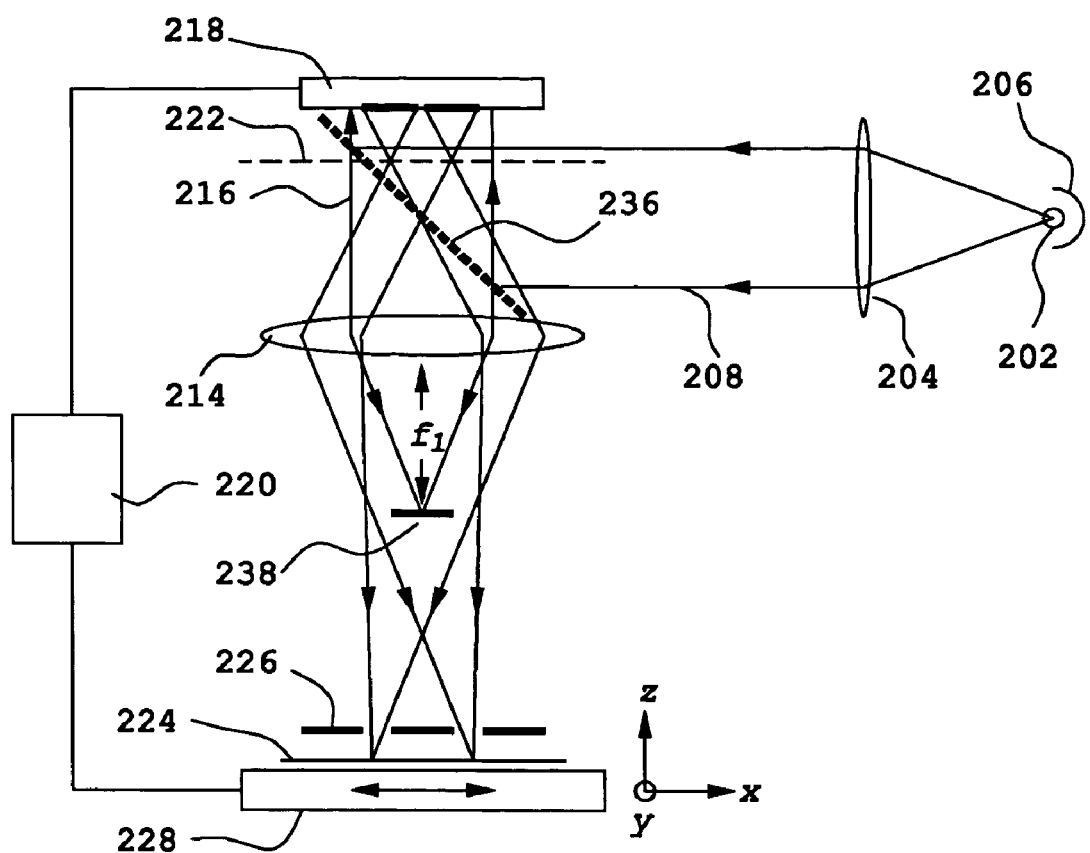
FIG. 7 is a general schematic representation of a large-field high-resolution pattern generating system of the type shown in FIG. 5 with an alternative illumination method.

Another way to illuminate the ZPM array is illustrated in FIG. 7. The collimated waves 208, after being folded 90 degrees by a beam splitter 236, impinge on the ZPM array 218 at the normal direction to the ZPM array. The waves diffracted by the ZPM array 218 pass through the beam splitter 236 and propagate towards the imaging lens assembly 214. After being filtered by the band-pass filter comprising the zeroth-order stop 238 and the high-order aperture stop 226, the light spots comprising of only the first-order diffracted waves are imaged onto the imaging surface 224 by the imaging lens assembly 214.

Figure 8:
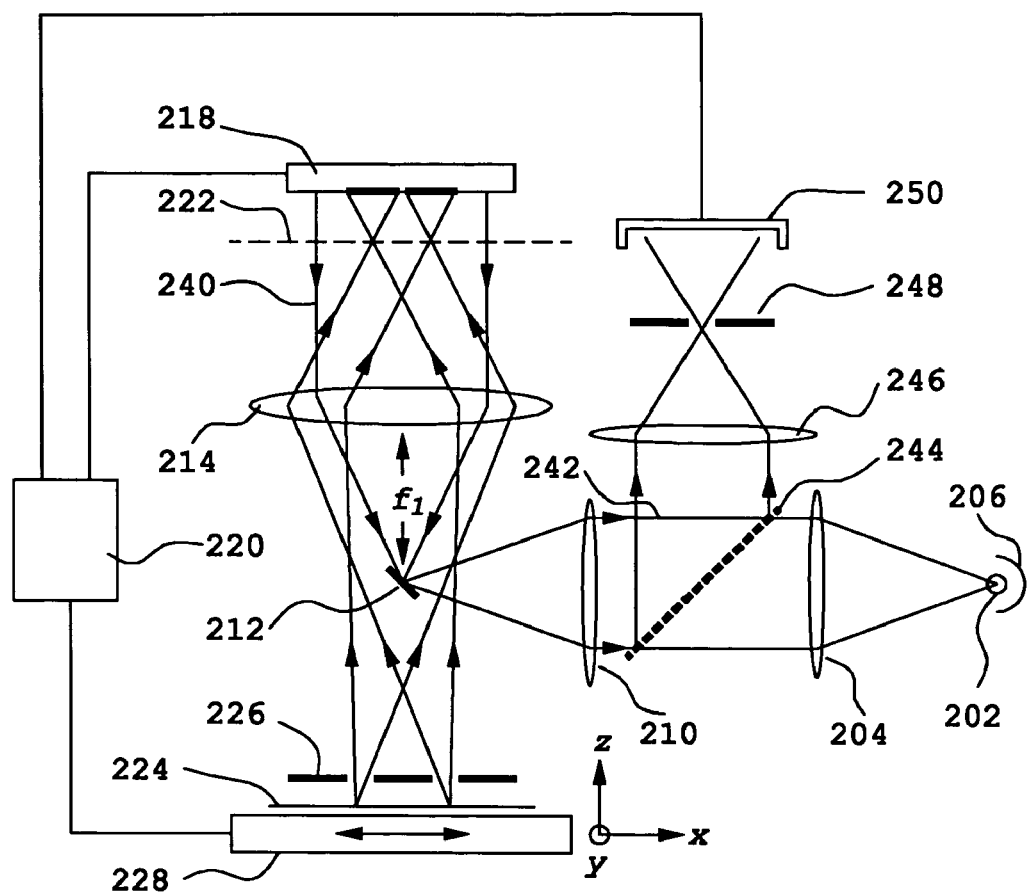
FIG. 8 is a general schematic representation of another embodiment of a large-field high-resolution pattern generating system comprising a ZPM array in accordance with the present invention, and integrated with a scanning confocal microscopy subsystem. The ZPM array is used for both pattern generation and scanning confocal microscopy.

Another embodiment of the present invention is shown in FIG. 8 and includes components for a parallel scanning confocal microscopy (SCM) by taking advantage of the imaging capability of ZPM elements. A ZPM array based SCM offers the same benefits as that of a spot array generator, and is capable of acquiring large-field and high-resolution images with increased throughput. In addition, the confocal property of the SCM provides accurate depth discerning capability and can be used to construct 3-D images. For the maximum optical efficiency of the SCM, all of the ZPM elements in the ZPM array, when used in the SCM mode, should be configured into the second configuration as phase zone plates where the relative distance between the first and the second zone plates is about $m/2+\frac{1}{4}$ of the wavelength of the illumination wave. The wave propagation paths in FIG. 8 are marked with arrows only in the directions for the SCM mode. It should be noted, however, that the high-resolution pattern generating process shares some of the same paths in the opposite directions, which are not marked with arrows in FIG. 8 for clarity.

The light waves reflected off the imaging surface 224 travel backwards through the imaging lens assembly 214 and form an array of light spots on the primary focal plane 222 of the ZPM array 218. The intensities of these light spots are modulated by the surface structures on the imaging surface 224. The ZPM array collimates the light spots into an array of parallel waves 240. The parallel waves 240 converge onto the folding mirror 212 through the imaging lens assembly 214. The waves, after having their propagation direction turned 90 degrees by the folding mirror 212, are re-collimated by the lens assembly 210 into parallel waves 242. A beam splitter 244 directs the parallel waves 242 towards a digital detecting means 250. A spatial filter 248, also known as a confocal aperture, is placed near the focal point of the lens assembly 246. Therefore, the spatial filter 248, the primary focal plane 222 of the ZPM array 218, and the imaging surface 224 are substantially confocal.

The digital detecting means 250, preferably a CCD camera, is placed at the conjugate plane of either the front surface or the primary focal plane 222 of the ZPM array 218 to acquire and store the digital images of the imaging surface 224, one frame at a time. The pixels of each static image are the points on the imaging surface 224, separated by a distance equal to the center-to-center spacing of the ZPM elements of the ZPM array 218, adjusted by the magnification of the imaging lens assembly 214. In conjunction with a subfield scanning means, the control circuitry 220 acquires and assembles all the frame images from the subfield scanning sequence to produce a complete high-resolution image of the imaging surface 224. Such a SCM capability is extremely useful for precision x-y-z alignment of the imaging surface in many applications, such as the multi-level lithographic alignments in photolithography. Integration of SCM with the high-resolution pattern generating system greatly reduces the size and improves the functionality of the system.

Figure 9:
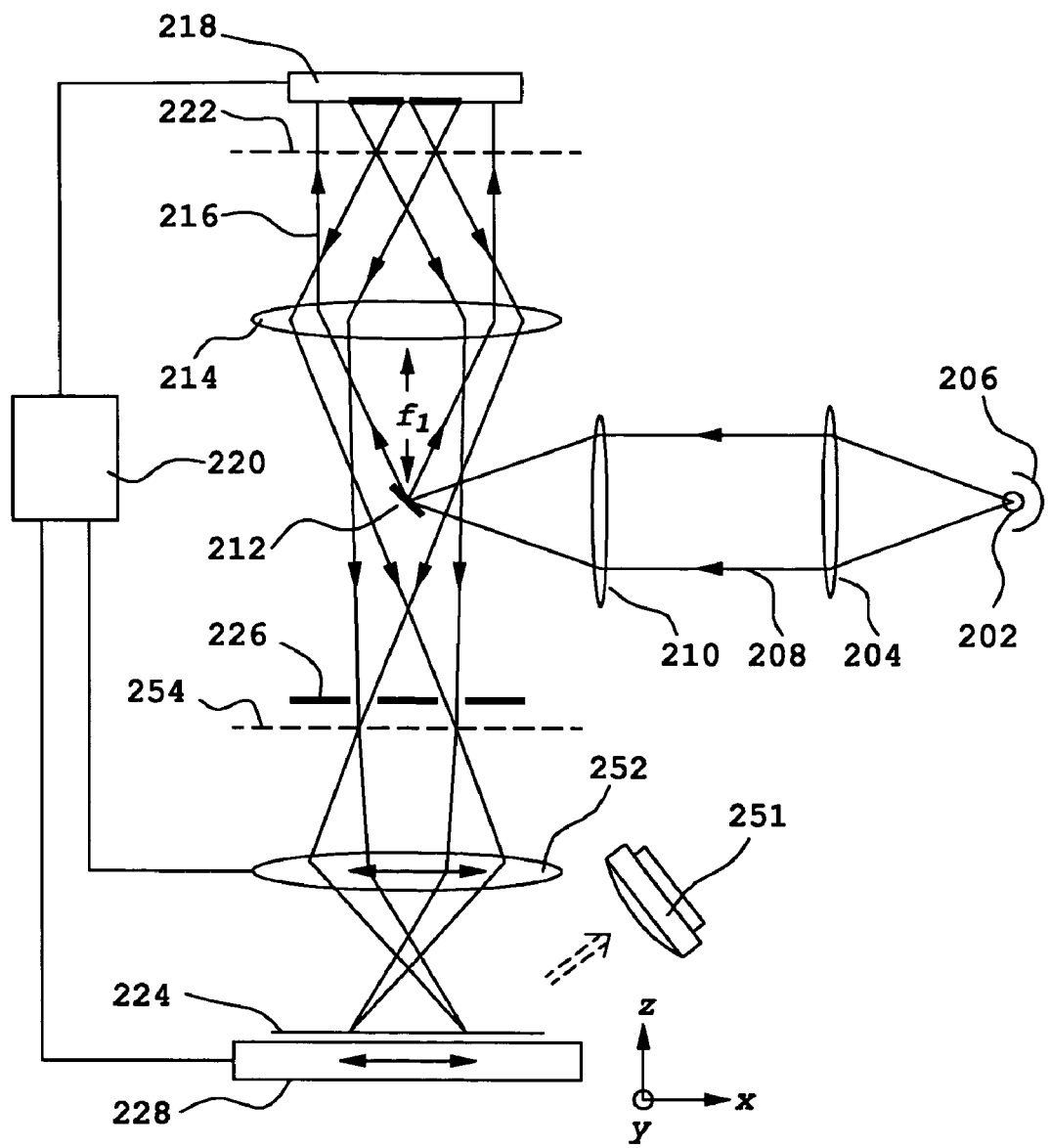
FIG. 9 is a general schematic representation of a large-field high-resolution pattern generating system of the type shown in FIG. 5 having a relay lens assembly for projecting the spot array on the intermediate image plane onto an imaging surface.

In comparison to the embodiment in FIG. 5, the embodiment shown in FIG. 9 adds a projection lens assembly 252. In FIG. 9, the first spot array on the primary focal plane 222 of the ZPM array 218 is imaged onto an intermediate image plane 254 as a second spot array with a predetermined magnification by the imaging lens assembly 214. The projection lens assembly 252 projects the second spot array on the intermediate image plane 254 onto the imaging surface 224. The projection lens assembly 252 makes it easier to manage the field size and the resolution of the pattern formed on the imaging surface 224. The large distance between the imaging surface 224 and the projection lens assembly 252 also provides better access to the imaging surface 224 and easier substrate handling. In addition, the subfield scanning means can be accomplished by displacing the projection lens assembly 252 along the x-y plane, while the imaging surface 224 remains stationary. Therefore, a complete large-field high-resolution image can be generated without the need for moving the imaging surface 224. An optical viewer 251 can be used for monitoring and assisting in the proper position or alignment of the imaging surface 224.

Figure 10:
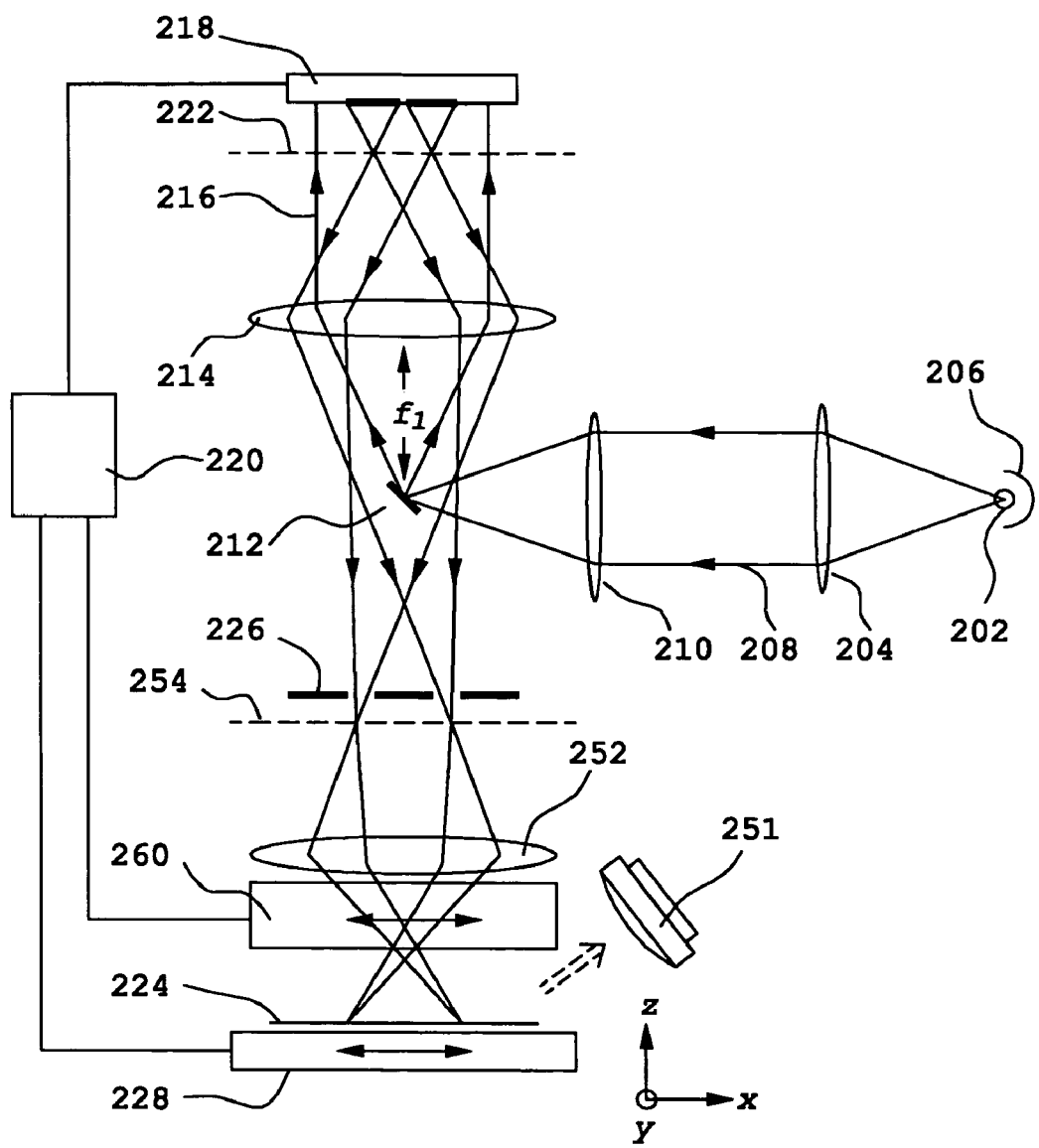
FIG. 10 is a general schematic representation of a large-field high-resolution pattern generating system, similar to the type shown in FIG. 9, integrated with a dedicated subfield scanning means. The subfield scanning means is used for filling in the spaces between the spots created by the ZPM array without the need of moving the imaging surface.

In comparison to the embodiment in FIG. 9, the embodiment shown in FIG. 10 incorporates a dedicated subfield scanning means 260. The subfield scanning means scans the light spots across the imaging surface 224 along the x-y plane. The imaging surface 224 remains stationary during the subfield scanning. The advantage of using a dedicated subfield canning means is that a complete large-field high-resolution image can be generated without the need for moving the imaging surface. The operation of the scanning means is synchronized with the frame data sent to the ZPM array 218 by the control circuitry 220. The scanning means suitable for the task includes acoustic optical modulators, rotating mirrors, scanning mirrors, polygon scanners, shifting mirrors, and by shifting the lens assemblies along the x-y plane. Superfield images can be made by stitching a plurality of field images together through stepping the movable stage 228.

Figure 11:
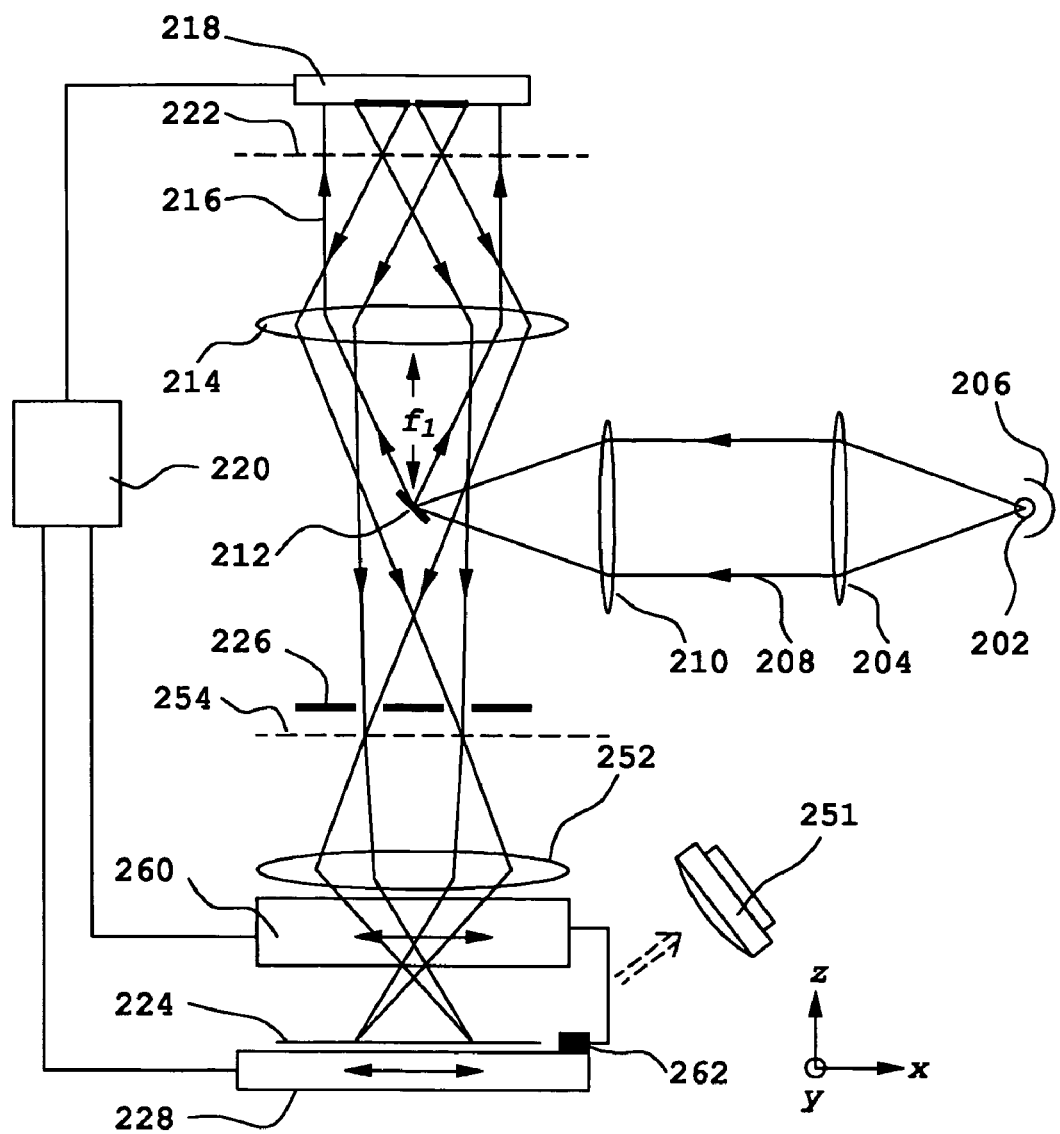
FIG. 11 is a general schematic representation of a large-field high-resolution pattern generating system of the type shown in FIG. 10 with a position detection means for improving the scanning accuracy of the scanning process.

In comparison to the embodiment in FIG. 10, the embodiment shown in FIG. 11 incorporates a position detection means 262. The detection means 262 moves synchronously with the imaging surface 224 and measures the position of the light spots during the subfield scanning. The detection means 262 sends the error signal to the subfield scanning means 260 to correct any positional error. For example, a semiconductor position sensitive detector (PSD), which is widely used for high-speed, high-accuracy position detection, can be positioned on the movable stage and to intercept one of the light spots or a fiduciary light beam to directly measure the movement of the subfield scanning means. The subfield scanning means 260 and the detection means 262 constitute a feedback system that provides an improved positioning accuracy of the subfield scanning. The detection means may be a CCD camera or a group of one or more position sensitive detectors (PSD).

The light spots in a spot array generated by a ZPM array can be used to generate a second spot array of waves having different properties, such as charged particle beams or light waves of different wavelength. Charged particle beams include electron beams and ion beams. An electron beam lithography system using a combination of a programmable optical radiation source and a photon-electron converter to provide an array of light controllable electron beam sources was disclosed by Tihiro Ohkawa (U.S. Pat. No. 6,014,203, filed on Jan. 27, 1998, issued on Jan. 11, 2000), in which the programmable optical radiation source was a display panel/light source such as a liquid crystal display panel.

Figure 12:
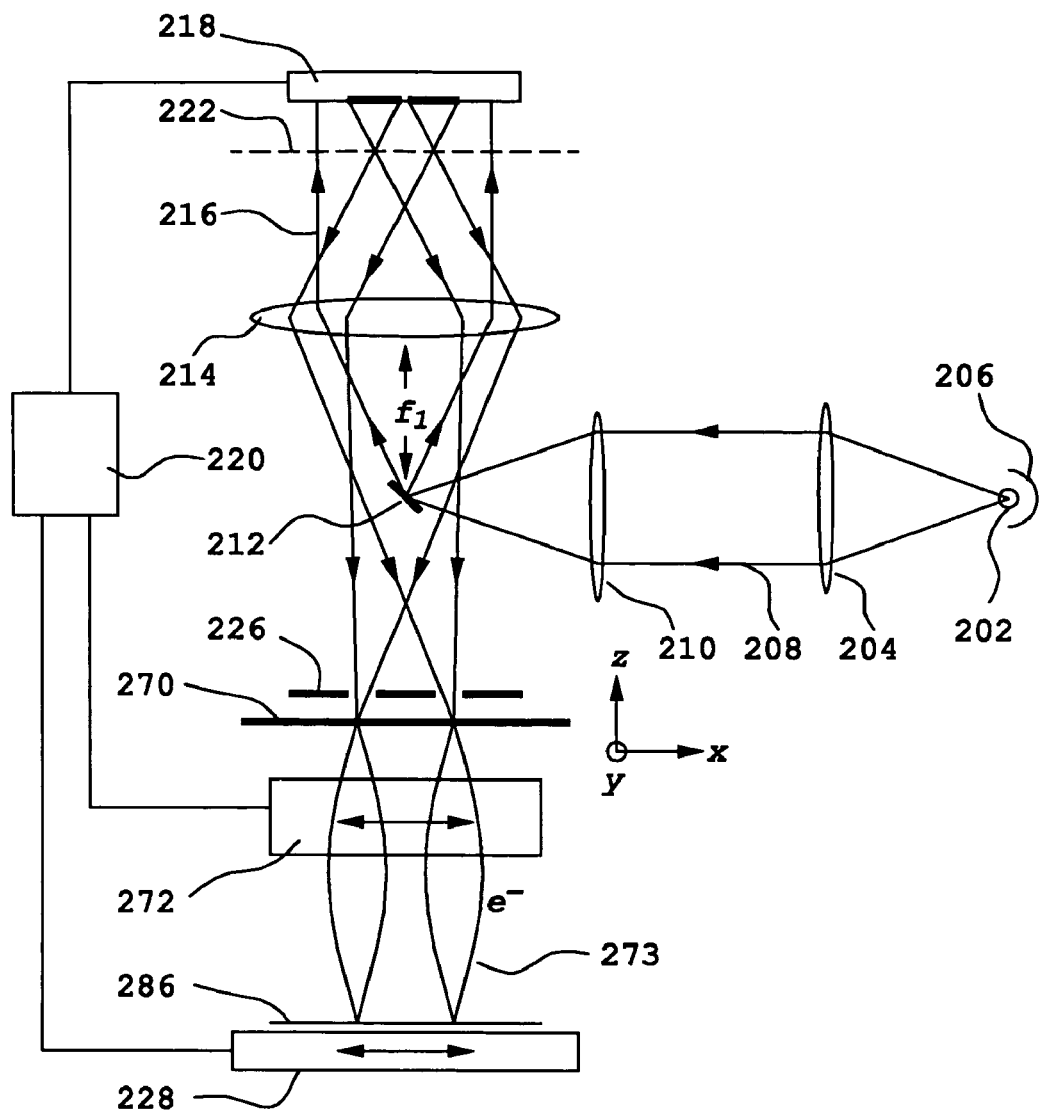
FIG. 12 is a general schematic representation of another embodiment of a large-field high-resolution pattern generating system comprising a ZPM array and a converter plate in accordance with the present invention. The converter plate converts a first spot array generated by the ZPM array into a second spot array of waves having different properties.

Shown in FIG. 12 is an embodiment of a large-field high-resolution pattern generating system incorporating a ZPM array 218 and a photon-charged particle converter 270 to convert the light spots generated by the ZPM array 218 into an array of charged particle beam sources. The use of ZPM arrays as spot array generators to activate charged particle beam sources makes it possible to increase the density and the switching speed of the charged particle beam sources, therefore resulting in the increased throughput of pattern generation.

Figure 13A:
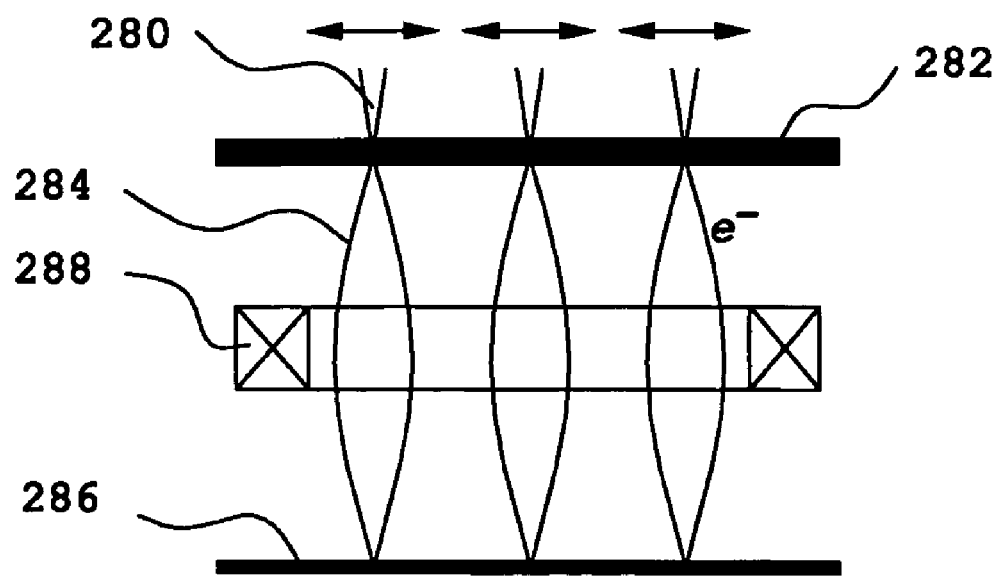
FIG. 13a is a general schematic view illustrating an arrangement of a photocathode photon-electron converter plate and magnetic focusing/scanning coils for focusing and scanning the electron beams, as part of the system of FIG. 12.

In one embodiment of the present invention, the photon-charged particle converter is a photon-electron converter comprising a photocathode plate, as illustrated in FIG. 13a. The light spots 280 generated by a ZPM array illuminate isolated areas on a photocathode plate 282 causing these isolated areas to emit electron beams 284. Further, the light spots can be scanned (as indicated by the double arrows) along the plane of the photocathode plate using a subfield scanning means (not shown) to provide an even higher-density array of controllable electron beam sources.

Figure 13B:
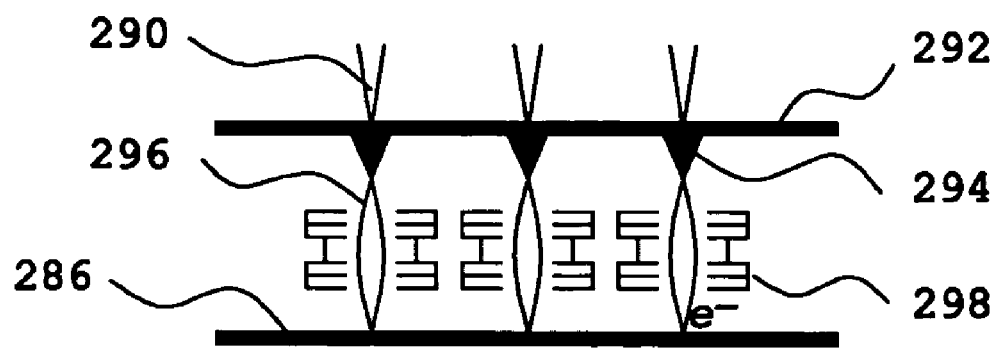
FIG. 13b is a general schematic view illustrating an arrangement of a photon-electron converter plate comprising a plurality of field emission tips in conjunction with a plurality of microcolumns for focusing and scanning electron beams, as part of the system of FIG. 12.

In another embodiment of the present invention as shown in FIG. 13b, the photon-charged particle converter is a photon-electron converter plate 292 comprising a plurality of field emission tips 294. The number and the periodicity of the field emission tips 294 match to the number and the periodicity of the light spots 290 illuminating the converter plate. The field emission tips 294 generate electron beams 296 when they are illuminated with lights.

Now referring to FIG. 12 again. A focusing and scanning means 272 focuses and scans the waves of the second spot array generated by the converter 270 onto an imaging surface 286. One or more characteristics of the material on the imaging surface are to be modified by the waves of the second spot array. In particular, the focusing and scanning means 272 comprises one or more electromagnetic/electrostatic lenses and/or electromagnetic scanning coils/electrostatic deflecting plates to focus and scan the electron beams 273 generated by the photo-electron converter plate 270 onto the imaging surface 286 layered with electron beam sensitive materials such as Poly(methyl methacrylate).

Various combinations of photon-electron converter plate and scanning and focusing means can be arranged. The setup shown in FIG. 13a illustrates an example of a photocathode plate 282 followed by an electromagnetic lens focusing and scanning assembly 288. Shown in FIG. 13b is another configuration. The focusing and scanning means comprises a plurality of microcolumns or miniature electrostatic lenses 298. Each of the microcolumns 298 is a miniature electrostatic electron beam focusing and scanning system, and is positioned directly beneath each electron emission point on the photo-electron converter plate. The method of design, use and operation of electromagnetic/electrostatic lenses, electromagnetic scanning coils/electrostatic deflecting plates, and microcolumns are widely used and are well known in the electron optics art. Accordingly, detained descriptions of these components are not presented herein.

In another embodiment of the present invention, the converter plate 270 in FIG. 12 is photon—photon converter plate, and converts the first spot array generated by the ZPM array 218 into a second spot array of light spots having a different wavelength through processes including two-photo conversion, lasing, fluorescence, or luminescence. Accordingly, the focusing and scanning means 272 comprises one or more imaging lens assemblies and a scanning means.

Owing to the high optical efficiency provided by the reflective optics in the very short wavelength range, such as x-ray or extreme UV, systems incorporating all reflective optics have been widely used in the fields of high-resolution lithography and high-resolution imaging. For example, Srinivas Bollepalli, et al., *J. Vac. Sci. Technol.* B(17), p 2992 (1999), demonstrated the principle of an EUV lithographic system using all reflective optics.

Figure 14:
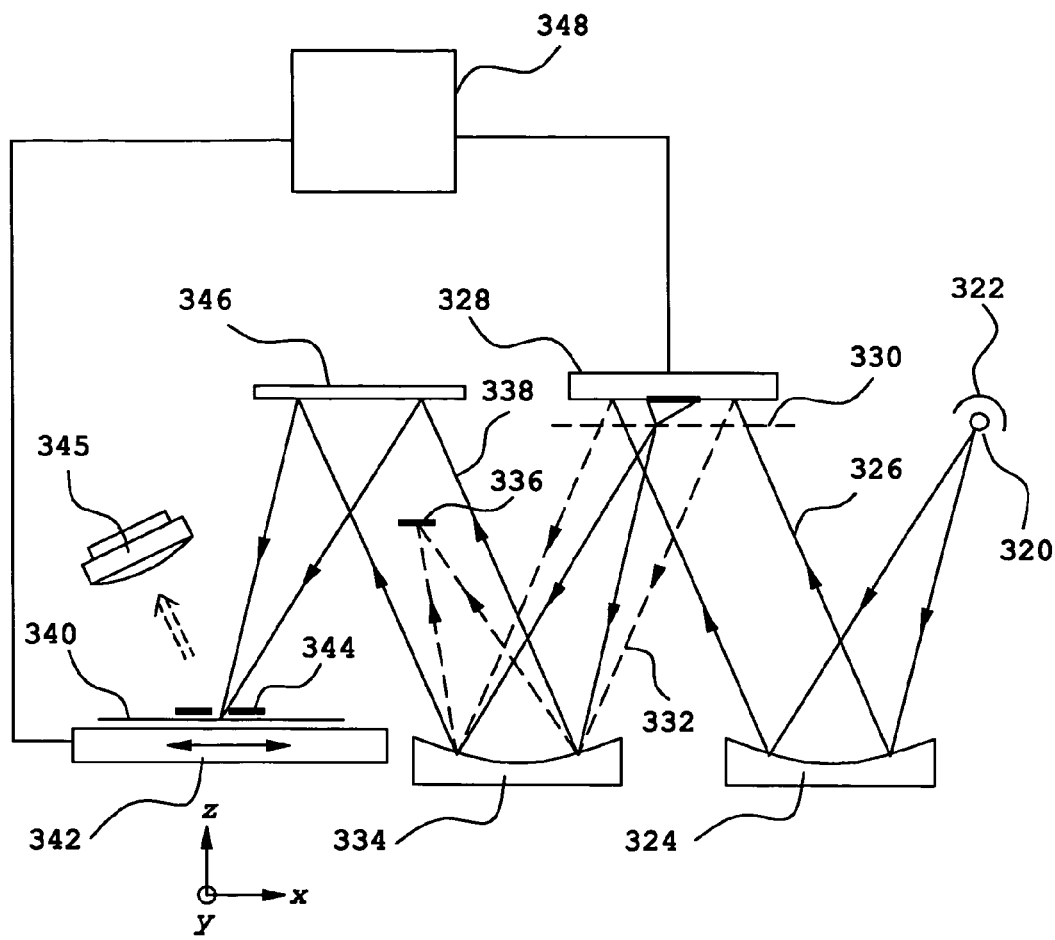
FIG. 14 is a general schematic representation of another embodiment of a large-field high-resolution pattern generating system comprising a ZPM array and all reflective optics in accordance with the present invention.

FIG. 14 shows one embodiment of the present invention incorporating ZPM arrays comprising all reflective optics arranged in a dark field configuration. The light waves produced by a light source 320 are collimated by a reflective collimating lens assembly 324. A reflector 322 is placed behind the light source 320 to increase the collecting efficiency of the light source. The collimated light waves 326 illuminate a ZPM array 328 at a predetermined angle in an off-axis configuration. The waves diffracted and spatially modulated by the individual ZPM elements in the ZPM array 328 form a spot array on the primary focal plane 330 of the ZPM array 328. For clarity, only one representative ZPM element is shown in the figure. A reflective imaging lens assembly 334 is arranged in such a way that the primary focal plane 330 of the ZPM array 328 is at the conjugate plane of the imaging surface 340. Therefore, the light spots formed on the primary focal plane 330 by the ZPM array 328 are imaged onto the imaging surface 340 by the reflective imaging lens assembly 334 with a predetermined magnification. An optical viewer 345 can be used for monitoring and assisting in the proper position or alignment of the imaging surface 340.

The waves reflected by the ZPM array 328, represented by the dashed lines 332, propagate towards the reflective imaging lens assembly 334, and converge into a light spot. A stop 336 is placed at a distance from the reflective imaging lens assembly 334 of about a focal length of the reflective imaging lens assembly 334. The stop 336 blocks the reflected light waves while allowing the diffracted waves 338 to pass by. Optionally, a high-order diffraction aperture stop 344 is placed in front of the imaging surface 340 to filter out higher-order, except the first-order, diffractions allowing only the first-order diffracted waves to focus on the imaging surface 340. One or more folding mirrors 346 are placed in the optical path to reduce the overall size of the pattern generating system.

A complete high-resolution pattern is formed on the imaging surface 340 by filling in the spaces around the light spots using a subfield scanning means. In particular, the subfield scanning means is to move a movable stage 342 along the x-y plane. The position and the motion of the movable stage 342 during the subfield scanning is synchronized with the frame data sent to the ZPM array 328 by a control circuitry 348. A scanning confocal microscopy subsystem (not shown) similar to the one shown in FIG. 8 can also be incorporated herein to image the surface patterns on the imaging surface and to assist in aligning the imaging surface.

Figure 15:
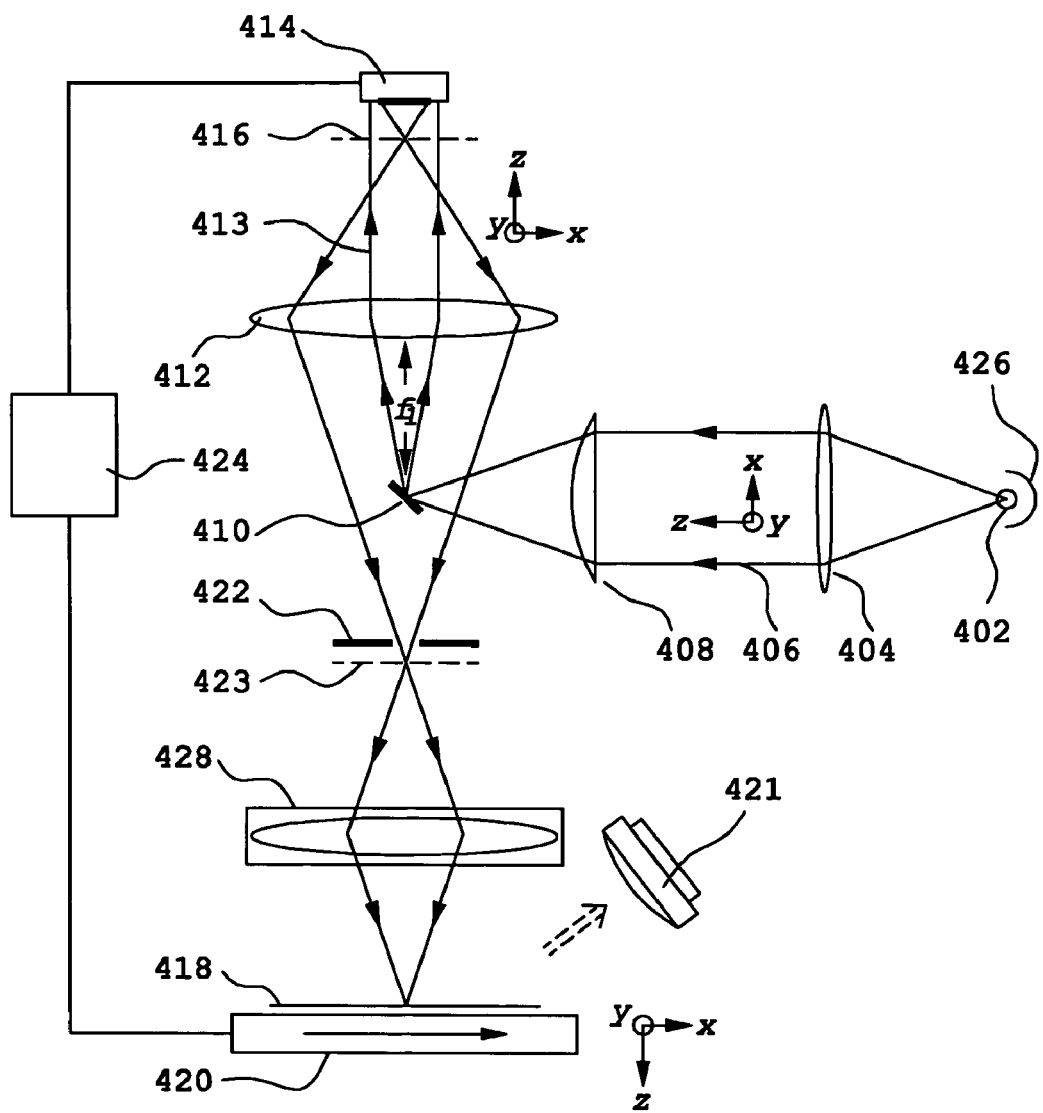
FIG. 15 is a general schematic representation of another embodiment of a large-field high-resolution pattern generating system comprising an one-dimensional or a staggered two-dimensional ZPM array and a dedicated subfield scanning means in accordance with the present invention.

FIG. 15 shows an embodiment of the present invention comprising an 1-D or staggered 2-D ZPM array. For clarity of discussion, the propagation direction of the illumination waves is defined as the z-direction. The x-axis is in the plane of the illustration, and the y-axis is perpendicular to the plane of the illustration. An 1-D ZPM array 414 is aligned in the y-direction, on the system optical z-axis. Light waves produced by a light source 402 are collimated by a collimating lens assembly 404. The collimated waves 406 are focused onto a strip mirror 410 by a cylindrical lens assembly 408. The strip mirror 410 is aligned in the y-direction, and is on the system optical z-axis. The cylindrical lens assembly 408 has refractive power only in one axis (the x-direction according to the coordinate convention as shown in FIG. 15), and causes the symmetrically collimated waves 406 to converge in the x-direction, and remain collimated in the y-direction. The action of the cylindrical lens assembly 408 transforms the symmetrically collimated waves 406 into a focused line on the strip mirror 410. The strip mirror 410 intercepts the converged waves and rotates the propagation direction of the converged waves by 90 degrees. The 45 degree inclination angle of the strip mirror 410 is chosen here for convenience of the illustration and should not be considered as limitation.

The converged waves are re-collimated by an imaging lens assembly 412 and illuminate the 1-D ZPM array 414 in the normal direction to the array. The 1-D ZPM array, oriented with its long dimension in the y-direction, is properly illuminated by the asymmetrical illumination waves 413. The waves diffracted and spatially modulated by the individual ZPM elements in the 1-D ZPM array 414 form a 1-D spot array, also running in the y-direction, on the primary focal plane 416 of the 1-D ZPM array 414. The imaging lens assembly 412 is arranged in such a way that the primary focal plane 416 of the ZPM array 414 is at the conjugate plane of the intermediate image plane 423. Therefore, the light spots formed on the primary focal plane 416 by the ZPM array 414 are imaged onto the intermediate image plane 423 by the imaging lens assembly 412 with a predetermined magnification.

The waves reflected by the ZPM array 414, on the other hand, converge to a focused line on the strip mirror 410. Here, the strip mirror 410 serves both as a wave folding mirror and a zeroth-order stop. It blocks the reflected waves and prevents these waves from reaching the imaging surface. Optionally, a 1-D high-order diffraction aperture stop 422 is placed in front of the intermediate image plane 423 to filter out higher, except the first, order diffractions allowing only the first-order diffracted waves to pass through. The image formed on the imaging surface 418 is 1-D spot array with the intensities of individual light spots being modulated by the pattern data sent to the 1-D ZPM array 414.

A subfield scanning means 428 scans the light spots in the y-direction to fill in the spaces between the light spots in the 1-D spot array, forming a complete line image on the imaging surface 418. The subfield scanning means 428 may be a scanning mirror, a rotating mirror, or a movable lens assembly having a predetermined magnification.

A complete 2-D large-field high-resolution pattern is formed by scanning the imaging surface 418 via a movable stage 420 in the x-direction, one line at a time, until all line images are generated. The position of the movable stage 420 and the position of the scanning means 428 are all synchronized with the frame data sent to the ZPM array 414 by a control circuitry 424. An optical viewer 421 can be used for monitoring and assisting in the proper position or alignment of the imaging surface 418.

In another embodiment, the ZPM array 414 in FIG. 15 is a staggered 2-D ZPM array. With a staggered 2-D ZPM array, a 1-D spot array with much higher linear spot density can be generated. By properly choosing the shifting distance between the rows of ZPM elements, a staggered array can eliminate the need of the subfield scanning means. Accordingly, a complete 2-D high-resolution pattern is generated by scanning the imaging surface 418 only in the x-direction with a properly formatted pattern data by taking into account of the row shifts in the staggered 2-D ZPM array 414.

Figure 16:
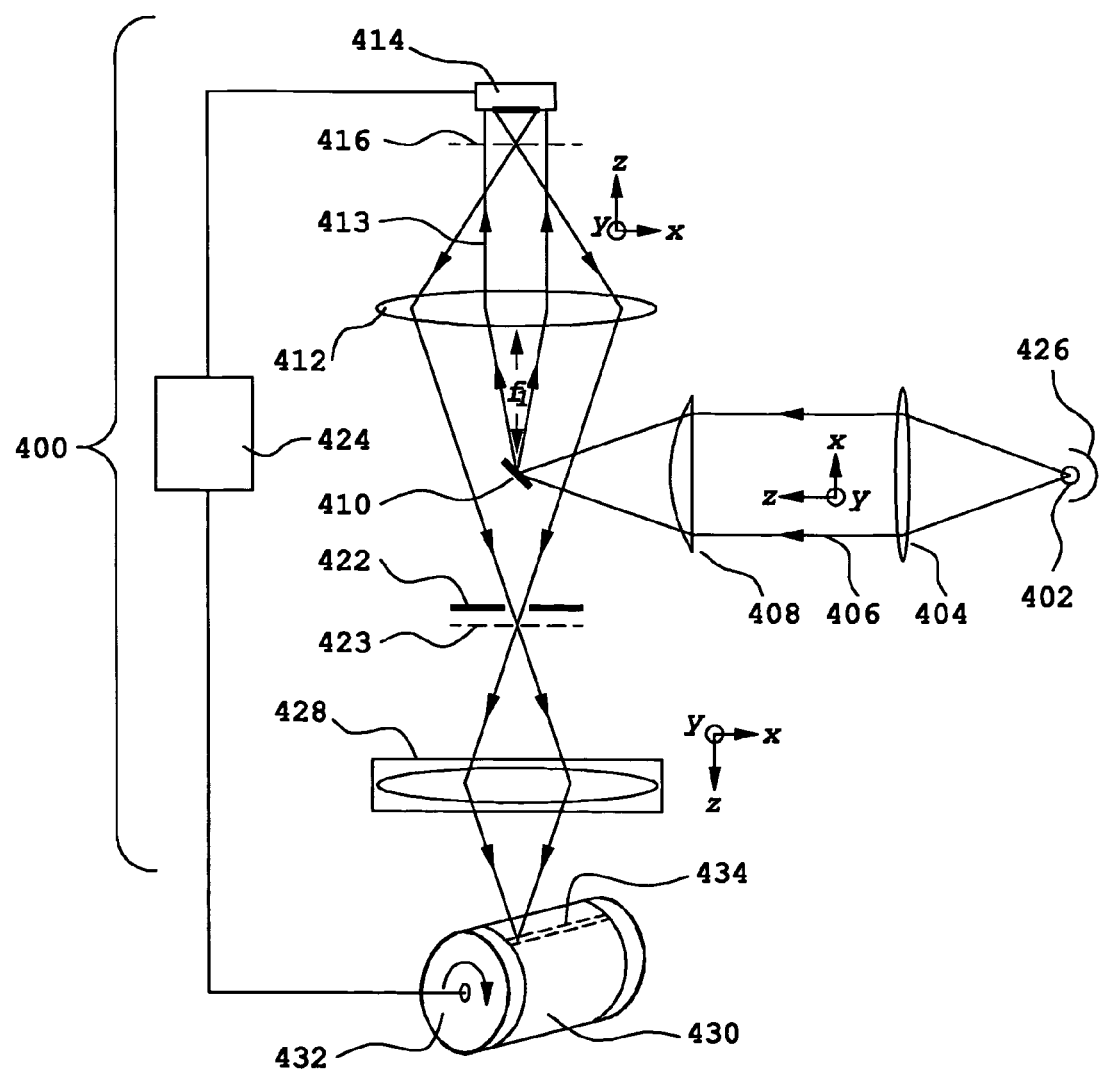
FIG. 16 is a general schematic representation illustrating a system of FIG. 15 arranged as an optical printer, with the imaging surface of FIG. 15 replaced by a drum assembly comprising a photoconductive printing medium.

The embodiments according to the present invention can be adapted to various applications by changing the imaging surface and the stage holding the imaging surface. By way of examples, FIG. 16 shows an optical printer incorporating the embodiment of FIG. 15 of the present invention. In general, optical printers are widely used for printing texts and graphics on papers and transparencies. Optical printers are also used by printing press to generate offset printing plates. In FIG. 16, a rotating drum assembly 432 is provided for holding and scanning a printing medium 430 comprising photoconductive materials. Each complete line image generated by the high-resolution pattern generating system 400 creates a latent line image 434 along the y-direction on the printing medium 430. The generation of the line image and the rotation of the drum assembly 432 are synchronized by the control circuitry 424 to form a 2-D latent image on the printing medium 430. Those skilled in the art to which the present invention pertains will recognize that a complete optical printing system may also includes other complex arrangements for printing medium preparation, toner handling, and pager handling, etc. As such arrangements are well-known in the art, a detailed description of these arrangements is not presented here.

Figure 17:
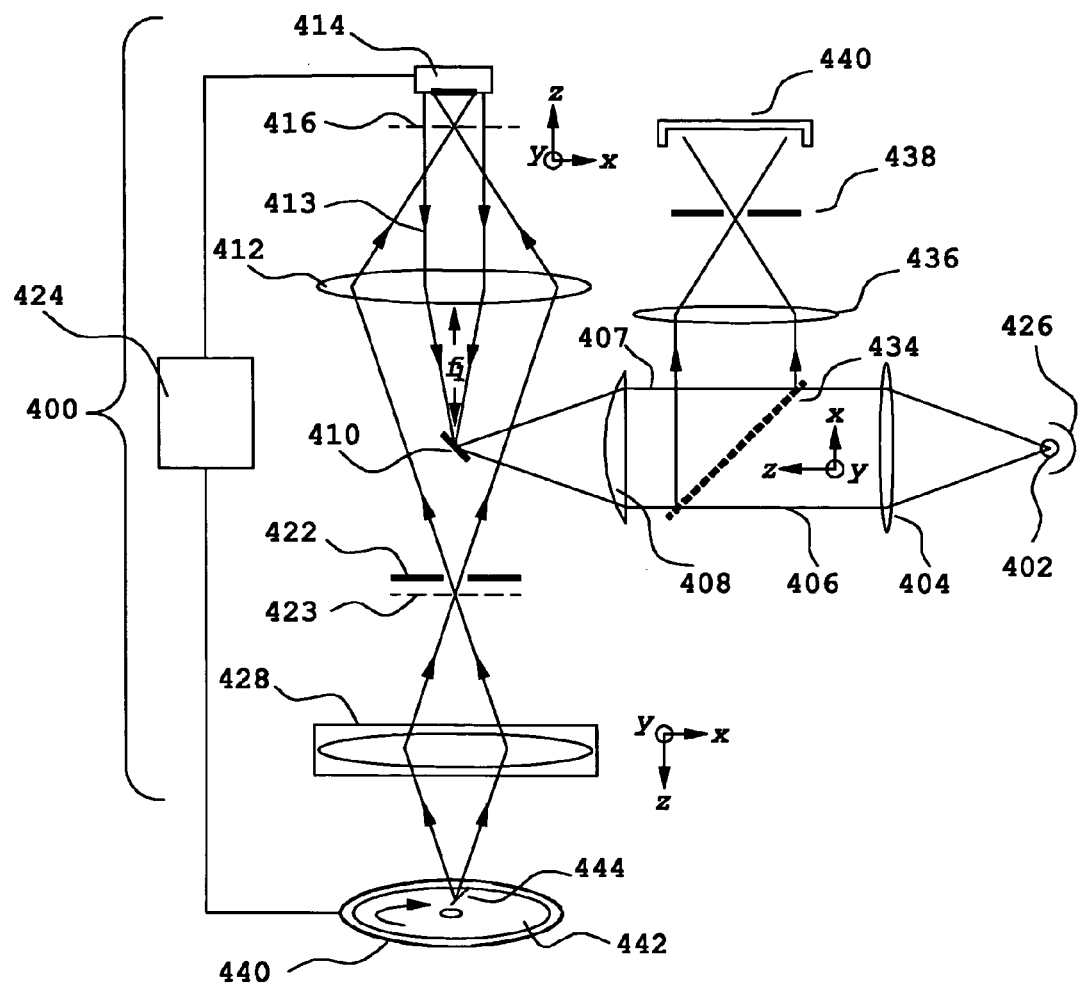
FIG. 17 is a general schematic representation illustrating a system of FIG. 15 arranged as an optical data storage and retrieval system, with the imaging surface of FIG. 15 replaced by a rotating platen having an optical recording medium, and incorporating a scanning confocal readout subsystem for converting the recorded data on the recording medium back to electrical signals.

FIG. 17 shows an optical data storage and retrieval system incorporating the embodiment of FIG. 15. In general, optical data storage and retrieval relates to placing information, consisting of data marks and spaces, onto the surface of an optical recording medium so that, when a light beam scans the surface, the reflected light can be used to recover the information. The system shown in FIG. 17 includes an in-plane rotating platen 440 comprising a layer of optical recording medium 442. One or more of the characteristics of the optical recording medium are changed by the light beams. Such optical recording medium includes phase-changing materials, dye-polymers, and magneto-optical materials.

For clarity, only the propagation directions of light waves during playback phase are marked with arrows. Each light spot in the spot array is aligned with one circular or spiral data track on the platen. Alternatively, each light spot in the spot array is used to scan across a number of circular data tracks, one track at a time.

During the writing or recording phase, the image 444 generated by the high-resolution pattern generating system 400 is a line of light spots. The intensities of the light spots are set at a predetermined high power level above the threshold value of the recording medium, and are capable of modifying one or more characteristics of the recording medium. As the platen rotates, the intensities of the light spots are modulated by the ZPM array 414 according to the data, therefore storing the digital information onto the optical recording medium bit-by-bit.

During the reading or playback phase, the intensities of the light spots are set at a predetermined lower power level below the threshold value of the recording medium. The light spots are used to illuminate the bits on the recording medium without modifying them. The way the data are read back is very similar to the SCM in FIG. 8. The intensities of the lights reflected off the bits are modulated by the data marks and spaces on the recording medium 442. The reflected light waves travel backward through scanning assembly 428, pass through the high-order aperture stop 422 and the imaging lens assembly 412, and then reach the ZPM array 414. The ZPM elements in the ZPM array 414 are configured into the second configuration as phase zone plates, and collimate the waves reflected by the bits on the recording medium into parallel waves 413.

After passing the imaging lens assembly 412 again, these parallel waves converge onto a folding mirror 410, rotate their propagation direction by 90 degrees at the folding mirror 410, and then are re-collimated into parallel waves 407 by the lens assembly 408. The re-collimated waves, after being turned 90 degrees by a beam splitter 434, are imaged onto a detecting means 440. The detecting means, such as a CCD camera, is at the conjugate plane of either the front surface or the primary focal plane 416 of the ZPM array 414. A confocal aperture 438 is positioned at a distance from the imaging lens assembly 436 of about a focal length of the imaging lens assembly 436. As the platen rotates, the detecting means converts the optical information recorded on the recording medium into electrical signal.

Additionally, the recording platen 440 of the optical data storage and retrieval system in FIG. 17 may comprise a plurality of layers of recording medium. The confocal nature of the optical data storage and retrieval system in FIG. 17 makes it possible to discern depth information or data bits on each layers of the recording medium in both the recording and playback modes. Such an arrangement dramatically increases data storage density.

Figure 18:
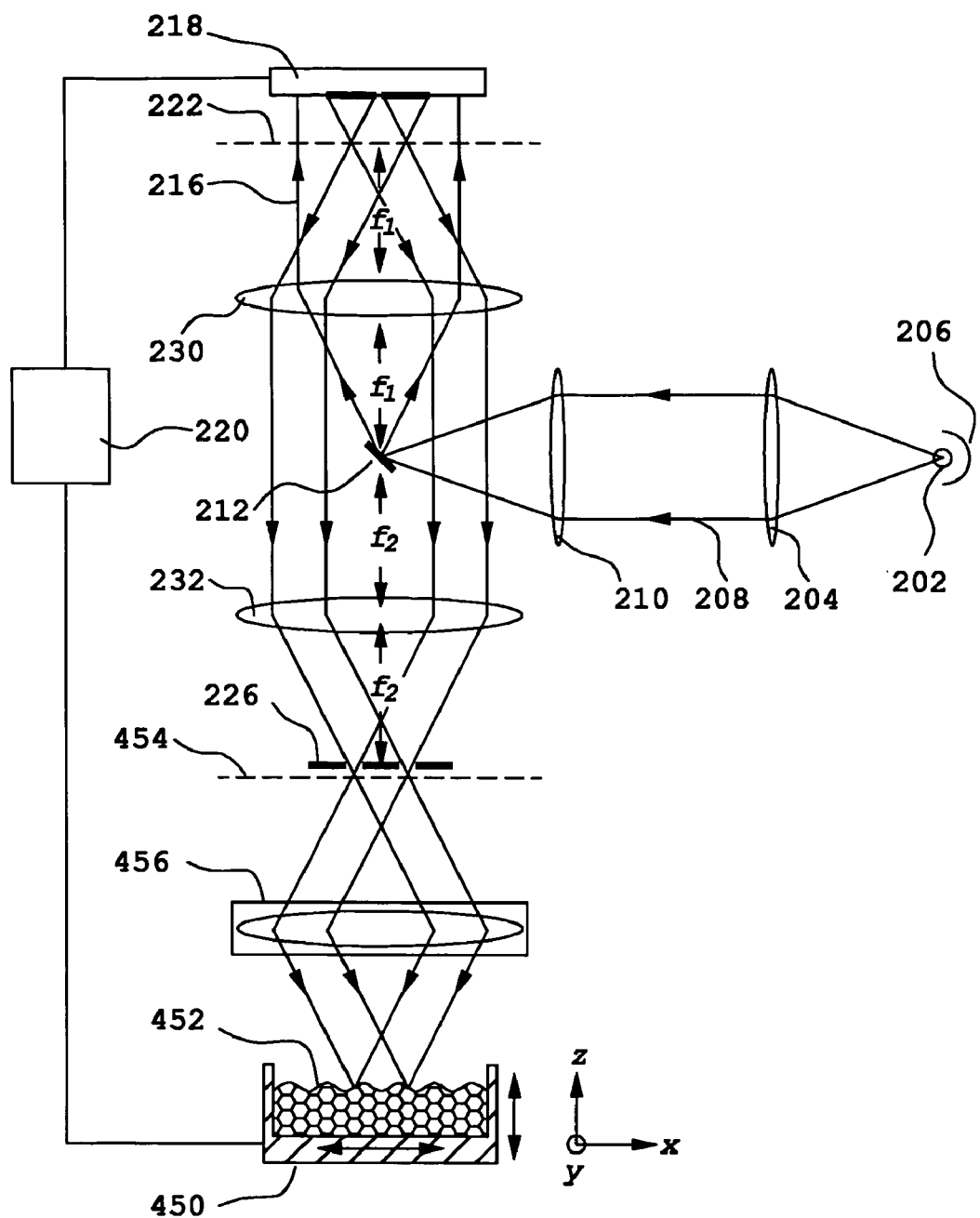
FIG. 18 is a general schematic representation illustrating a system of FIG. 6 arranged as a stereolithography system, with the imaging surface of FIG. 6 replaced by photopolymer in a movable holding tank.

Shown in FIG. 18 is a system for forming 3-D images or objects incorporating the embodiment of FIG. 6 of the present invention. This type of applications is referred to as stereolithography (SL) and carries a variety of names such as 3-D layering, rapid prototyping, or solid imaging. The idea is to build a 3-D object layer-by-layer optically. The stereolithography process starts with a 3-D computer-aided design (CAD) drawing. Special computer software slices the 3-D data into layers of 2-D patterns. Then the 2-D pattern data are used to build 2-D layers on photo-modifiable materials. Suitable photo-modifiable materials for this type of applications include 1) photopolymers, which can be cross-linked by ultraviolet light to form a solid, and 2) certain type of metals and ceramics, the particles of which can be melted or fused together by intense light beams.

The illustration shown in FIG. 18 is a stereolithography system using photopolymers. A holding tank 450 capable of moving in x-y-z directions is provided for holding photopolymer 452 in liquid form. The ZPM array 218 generates a spot array at an intermediate image plane 454. The intensities of individual light spots in the spot array are modulated by the frame data sent to the ZPM array 218 through a control circuitry 220. A subfield scanning assembly 456 relays the spot array on the intermediate image plane 454 onto a plane at the photopolymer 452 with a predetermined magnification, and scans the spot array along the x-y plane to cross-link the photopolymer 452, one layer at a time. After one layer is produced, the photopolymer is repositioned to expose another refresh layer of photopolymer liquid for cross-linking next layer until a 3-D object is completely built. The subfield scanning assembly 456 may comprise one or more lenses, shifting lenses, and/or scanning mirrors.

II. Direct Pattern generating systems incorporating ZPM arrays

Besides being used as spot array generators, ZPM arrays can further be incorporated into pattern generating systems in which the individual ZPM elements themselves, instead of their focal points, of a ZPM array are used to directly form the fundamental image pixels of the image on the imaging surface. In such systems, referred to as direct pattern generating systems herein, the ZPM elements are either reflectors where the reflected waves are used to represent the information or diffractors where the diffracted waves are used to represent the information. The optical efficiency of ZPM elements is approaching 100% in either case. The pattern generating systems are arranged in a bright field configuration when the ZPM elements are used as reflectors. Whereas, the pattern generating systems are arranged in a dark field configuration when the ZPM elements are used as diffractors. In addition to the high optical efficiency, ZPM arrays provide many other advantages including faster response time and higher bandwidth in comparison to conventional art such as liquid crystal display panels and rotating digital micromirror arrays.

The direct pattern generating systems disclosed here in accordance with the present invention can be configured for various applications including 2-D/3-D maskless lithographic system, optical printing system, optical recording system, projection display system, direct viewing system, and systems for surface modification/treatment/imprinting. Only examples of display systems incorporating ZPM arrays are illustrated hereon, and should not be considered as limitations.

Figure 19:
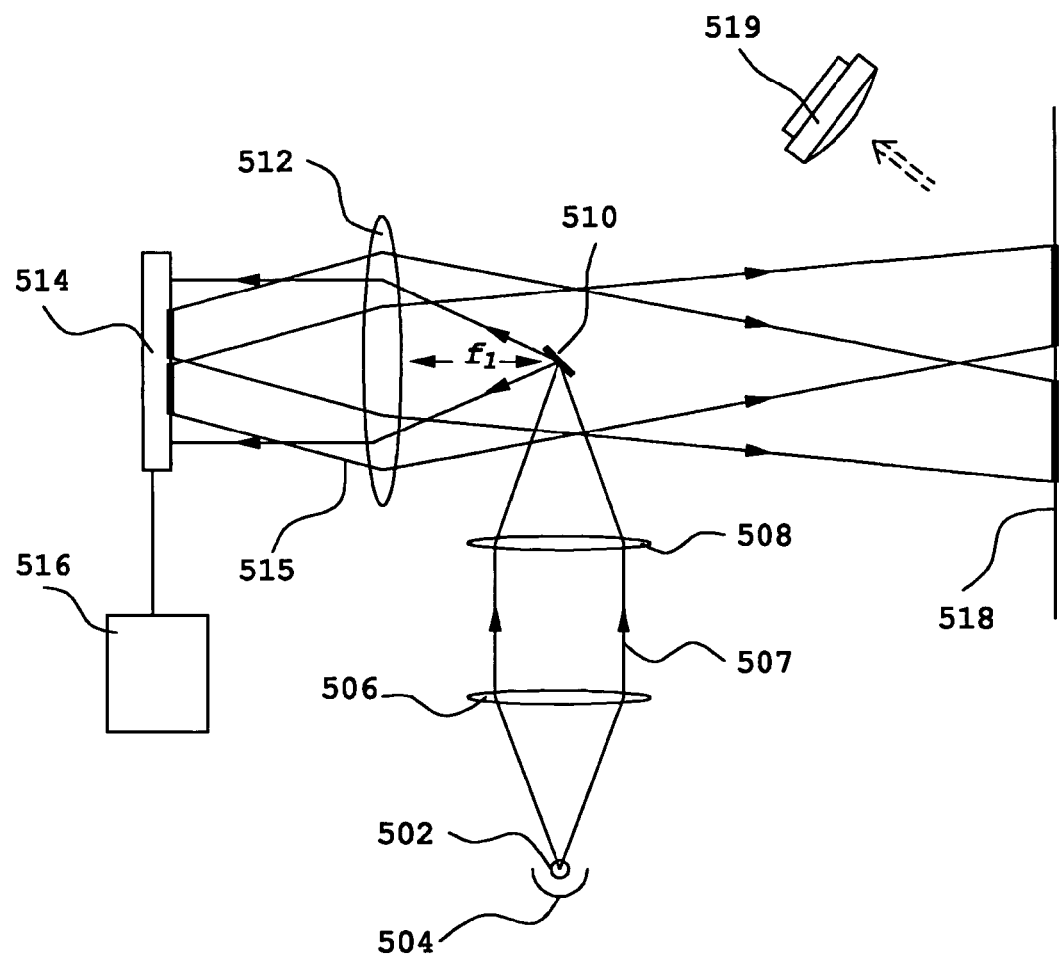
FIG. 19 is a general schematic representation of one embodiment of a direct pattern generating system comprising a ZPM array, arranged as a projection display system in a dark field configuration in accordance with the present invention.

Now referring to FIG. 19, one embodiment of a projection display system in accordance with the present invention is illustrated. The projection display system includes a ZPM array 514 that is used as a diffractor array. Light waves generated by a light source 502 are collimated by a collimating lens assembly 506. Optionally, a reflector 504 is placed behind the light source 502 to increase the collecting efficiency of the light source. The collimated light waves 507 converge to a folding mirror 510, after passing through a lens assembly 508. The folding mirror 510 is placed at a distance from an imaging lens assembly 512 of about a focal length (f1) of the imaging lens assembly. The folding mirror 510, inclined at a 45 degree angle to the optical axis of the illumination system, rotates the propagation direction of the illumination waves by 90 degrees. The 45 degree inclination angle of the folding mirror 510 is chosen here for convenience of the illustration and should not be considered as limitation.

After leaving the folding mirror 510, the illumination waves diverge and are re-collimated by the imaging lens assembly 512. The re-collimated light waves illuminate the ZPM array 514 in the normal direction of the ZPM array. Light waves reflected from the ZPM array 514 converge to the folding mirror 510 after passing through the imaging lens assembly 512. The folding mirror directs the reflected light waves towards the light source 502, preventing them from reaching a projection screen 518. It is easy to see that the folding mirror 510 in the arrangement of FIG. 19 serves two purposes. It functions as a folding mirror to rotate the illumination waves 507. It also acts as a stop to block the reflected waves, and prevents them from reaching the projection screen 518.

Light waves 515 diffracted by the ZPM array 514 go around the folding mirror 510 and propagate towards the projection screen 518. The imaging lens assembly 512 is positioned in such a way that the front surface of the ZPM array 514 and the projection screen 518 are at conjugate positions. Therefore, the ZPM elements, serving as image pixels, are imaged directly onto the projection screen 518 by the imaging lens assembly 512. Here the imaging lens assembly 512 serves both as a collimating lens in the direction of the illumination, and as an imaging lens in the direction of diffracted waves. The imaging lens assembly 512 and the stop 510 constitute a telecentric dark field (Schlieren) imaging system. The intensities of light waves 515 diffracted by the ZPM array 514 are modulated by the ZPM array according to the pattern data through a control circuitry 516. Accordingly, a pattern or an image is projected on to the projection screen for viewing.

For 2-D or 3-D maskless lithography applications, the projection screen 518 is replaced by a substrate layered with materials sensitive to the illumination waves. For optical printer, the projection screen 518 is replaced by an optical printing medium. For optical data storage and retrieval applications, the projection screen 518 is replaced by an optical recording medium. An optical viewer 519 can be used for monitoring and assisting in the proper position or alignment of the substrate for lithographic applications.

Figure 20:
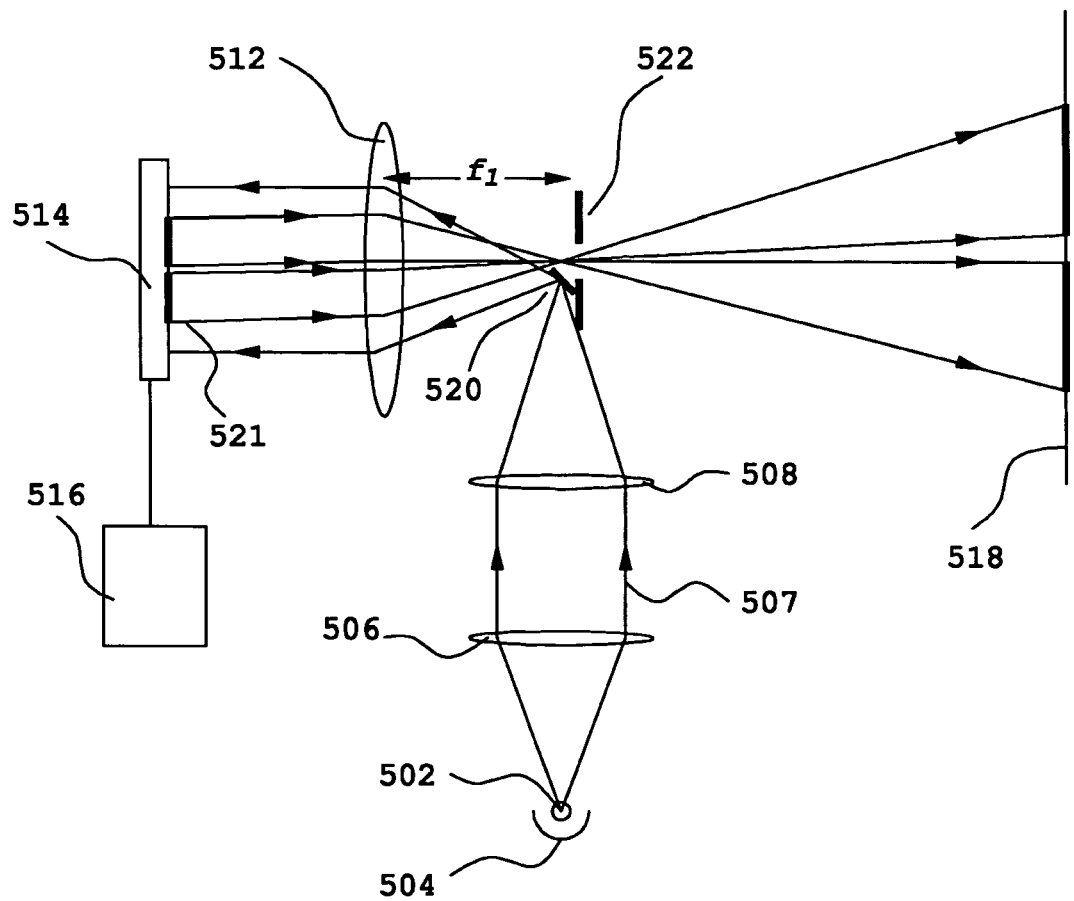
FIG. 20 is a general schematic representation of one embodiment of a direct pattern generating system comprising a ZPM array, arranged as a projection display system in a bright field configuration and with an off-axis illumination in accordance with the present invention.

FIG. 20 shows an embodiment of a bright field projection display system. In comparison to FIG. 19, the folding mirror 520 is placed near the focal point, but off the optical axis of the imaging lens assembly 512. Accordingly, the ZPM array 514 is illuminated through an off-axis illumination method. A high-order aperture stop 522 is also placed off-axis at a distance behind the imaging lens assembly 512 of about the focal length (f1) of the imaging lens assembly. The high-order aperture stop 522 is basically a plate having a hole of predetermined diameter, and only allows reflected or the zeroth-order diffracted waves to pass through.

After passing through the imaging lens assembly 512, Light waves 521 reflected from the ZPM array 514 converge at the high-order aperture stop 522, go through the hole, and then reach the projection screen 518. On the other hand, light waves diffracted by the ZPM array, after passing through the imaging lens assembly, are blocked by the high-order aperture stop 522. The intensities of light waves 521 reflected by the ZPM array 514 are modulated by the ZPM array 514 according to the pattern data through a control circuitry 516. Accordingly, a pattern or an image is projected on to the projection screen for viewing.

Figure 21:
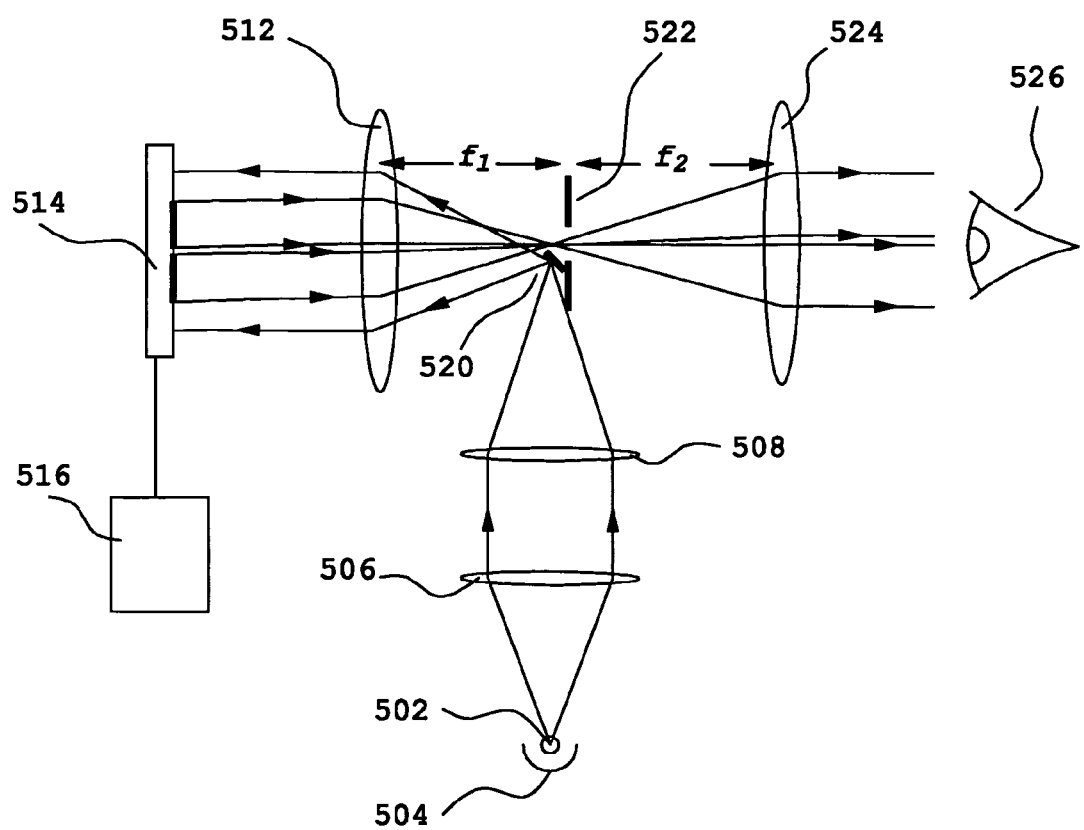
FIG. 21 is a general schematic representation of one embodiment of a direct pattern generating system comprising a ZPM array, arranged for direct viewing in a bright field configuration and with an off-axis illumination in accordance with the present invention.

The embodiment shown in FIG. 21 is a bright field direct viewing system with an off-axis illumination. In comparison to the embodiment in FIG. 20, the direct viewing system adds a second imaging lens assembly 524, while eliminating the projection screen. The second imaging lens assembly 524 is placed at a distance behind the high-order aperture stop 522 of about the focal length (f2) of the second imaging lens assembly 524. Therefore, the distance between the first imaging lens assembly 512 and the second imaging lens assembly 524 is about the sum of the focal length f1 and f2. Light waves reflected from the ZPM array 514, after passing through both the first imaging lens assembly 512 and the second imaging lens assembly 524, remain collimated, and can be viewed directly by an observer 526.

Color projection display/viewing systems can be configured using one or more ZPM arrays. It should be noted that the operation of a ZPM is wavelength dependent. Now referring to FIG. 2 briefly. For a ZPM in a first configuration (FIG. 2$b$) where the distance between the first zone plate 142 and the second zone plate 144 is m$\lambda$/2, the ZPM reflects the illuminating plane wavefront 154 as plane waves 156 just like a mirror. In a second configuration (FIG. 2$c$) where the distance between the first zone plate 142 and the second zone plate 144 is (m/2+¼)$\lambda$, the ZPM focuses the illuminating plane wavefront 154 into a series of focal points 158 just like a reflective phase zone plate. As the wavelength $\lambda$ is changed, the condition for the first configuration (C1) and the second configuration (C2) are changed accordingly.

Illumination systems for color projection display/viewing systems can be arranged in different ways. For example, a single broadband light source, such as a short-arc high-pressure lamp, can be used together with a color wheel to generate colored illuminations. The rotation of the color wheel is synchronized with the frame data of individual color images. Another way to generate multiple colors from a single light source is to use several dichroic mirrors. It is well known in the optical art that dichroic mirrors can be used to selectively reflect or transmit light waves having a predetermined wavelength. Alternatively, separate light sources, one for each color, can be used to generate multiple colors.

Figure 22:
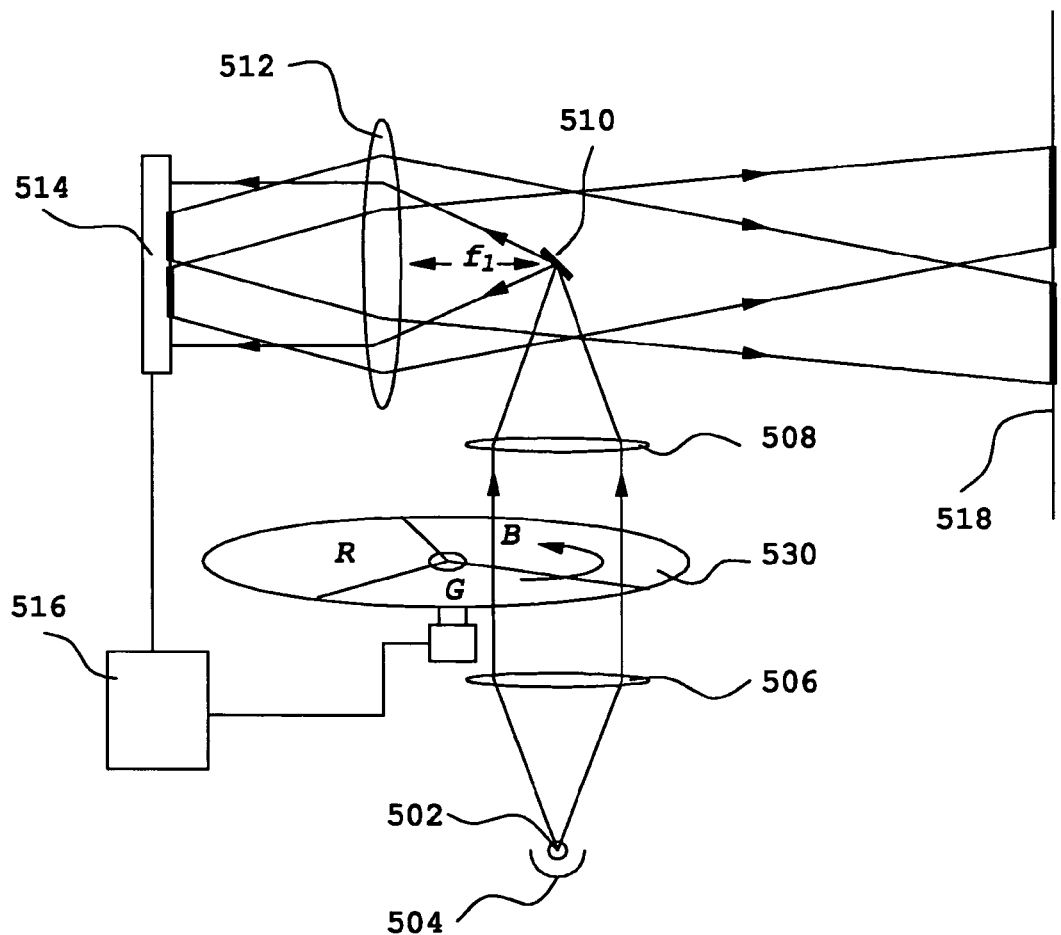
FIG. 22 is a general schematic representation of one embodiment of a direct pattern generating system comprising a ZPM array and a rotating color wheel, arranged as a color projection display system in a dark field configuration in accordance with the present invention.

FIG. 22 shows an embodiment of a color projection display system incorporating a single ZPM array in a dark field configuration and with a single broadband light source. In comparison to the embodiment of the projection display system in FIG. 19, the color projection display system in FIG. 22 adds a color wheel 530 having three color portions (R, G, B). The operation of the ZPM array 514 now includes three sets of configurations, one for each color (C1R and C2R, C1G and C2G, C1B and C2B). The ZPM array modulates the intensities of diffracted waves according to the color image data with appropriate color configuration settings. For example, to generate a green color image, the ZPM array modulates the intensities of diffracted waves according to the green color image data using the green color configuration settings (C1G and C2G), and at the same time, the green portion of the color wheel is positioned in the illumination path. The operation of the ZPM array 514 is synchronized with the rotation of the color wheel 530 through the control circuitry 516. Therefore a full color image is projected on the projection screen 518 with a predetermined magnification.

Figure 23:
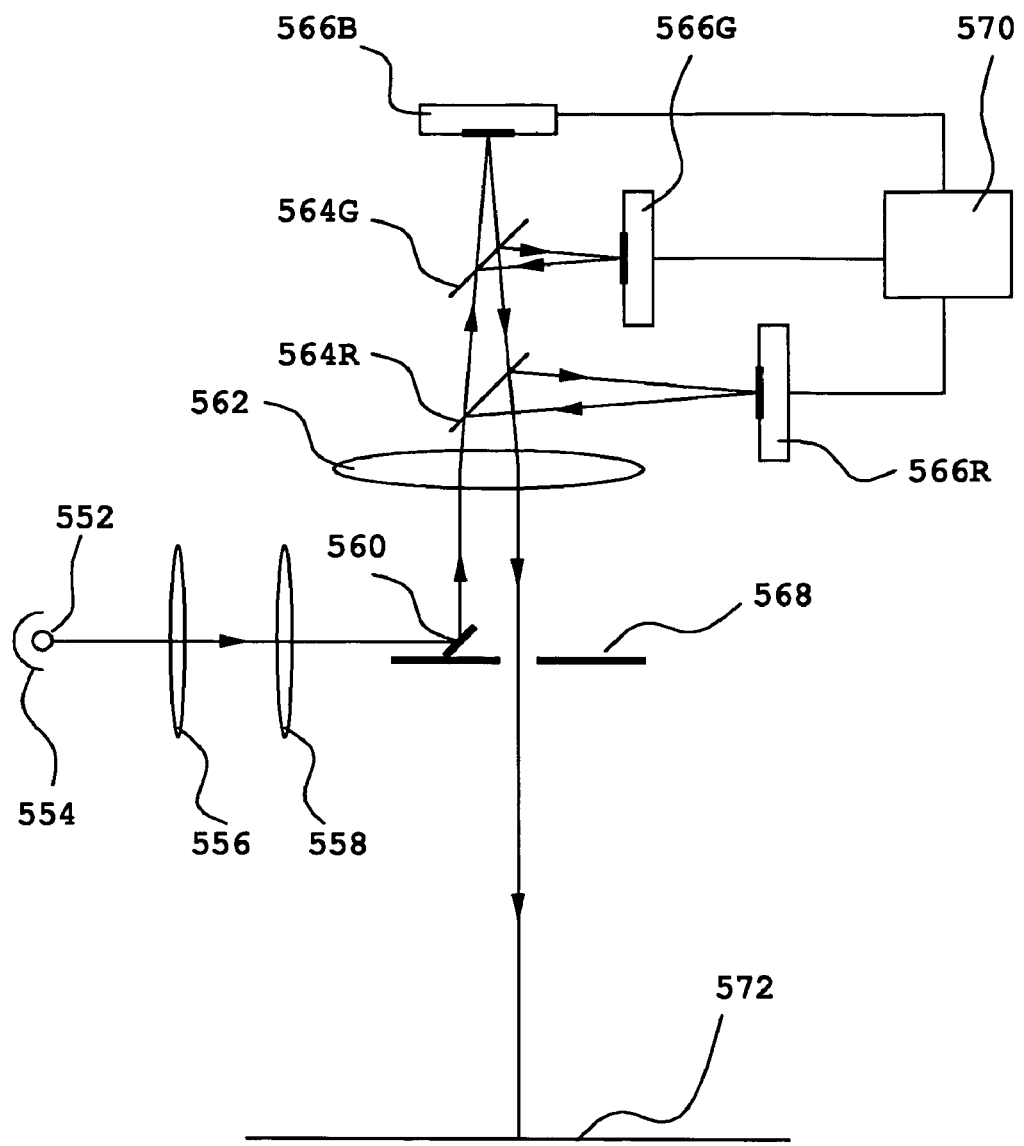
FIG. 23 is a general schematic representation of one embodiment of a direct pattern generating system comprising three ZPM arrays, arranged as a high performance color projection display system in a bright field configuration in accordance with the present invention.

FIG. 23 shows an embodiment of a color projection display system incorporating three ZPM arrays, one optimized for each colors (R, G, B), according to the present invention. The color projection display system is configured with a bright field arrangement and an off-axis illumination system. Light waves are generated by a broadband light source 552. A reflector 554 behind the light source increases the collecting efficiency of the light source. A collimating lens assembly 556 collimates the illumination waves. After passing through a lens assembly 558, the illumination waves converge onto a folding mirror 560 which is inclined at a 45 degree angle to the optical axis of the illumination system. The folding mirror 560 is placed near, but off the optical axis of an imaging lens assembly 562, and rotates the propagation direction of the illumination waves by 90 degrees. The illumination waves are re-collimated by the imaging lens assembly 562. The collimated illumination waves then pass through two dichromatic mirrors.

The first dichroic mirror 564R reflects red light towards the first ZPM array 566R, and allows green and blue lights to pass through. The second dichroic mirror 564G reflects green light towards the second ZPM array 566G, and allows blue light to pass through. The blue light waves, after passing the two dichroic mirrors, illuminate the third ZPM array 566B. The three ZPM arrays are positioned at a substantially equal distance to the imaging lens assembly 562. Therefore, the front surfaces of all three ZPM arrays are at the conjugate planes of the projection screen 572. The light waves reflected from the three ZPM arrays 566R, 566G, and 566B recombine through the two dichroic mirrors 564R and 564G, and are imaged onto the projection screen 572. A control circuitry 570 sends separate RGB frame data to the three ZPM arrays cooperatively. Therefore a full color image is projected on the projection screen 572 for viewing. Alternatively, an illumination system comprising three separated light sources, such as red, green, and blue color light-emitting diodes (LED), may be used to illuminate the three ZPM arrays.

Figure 24:
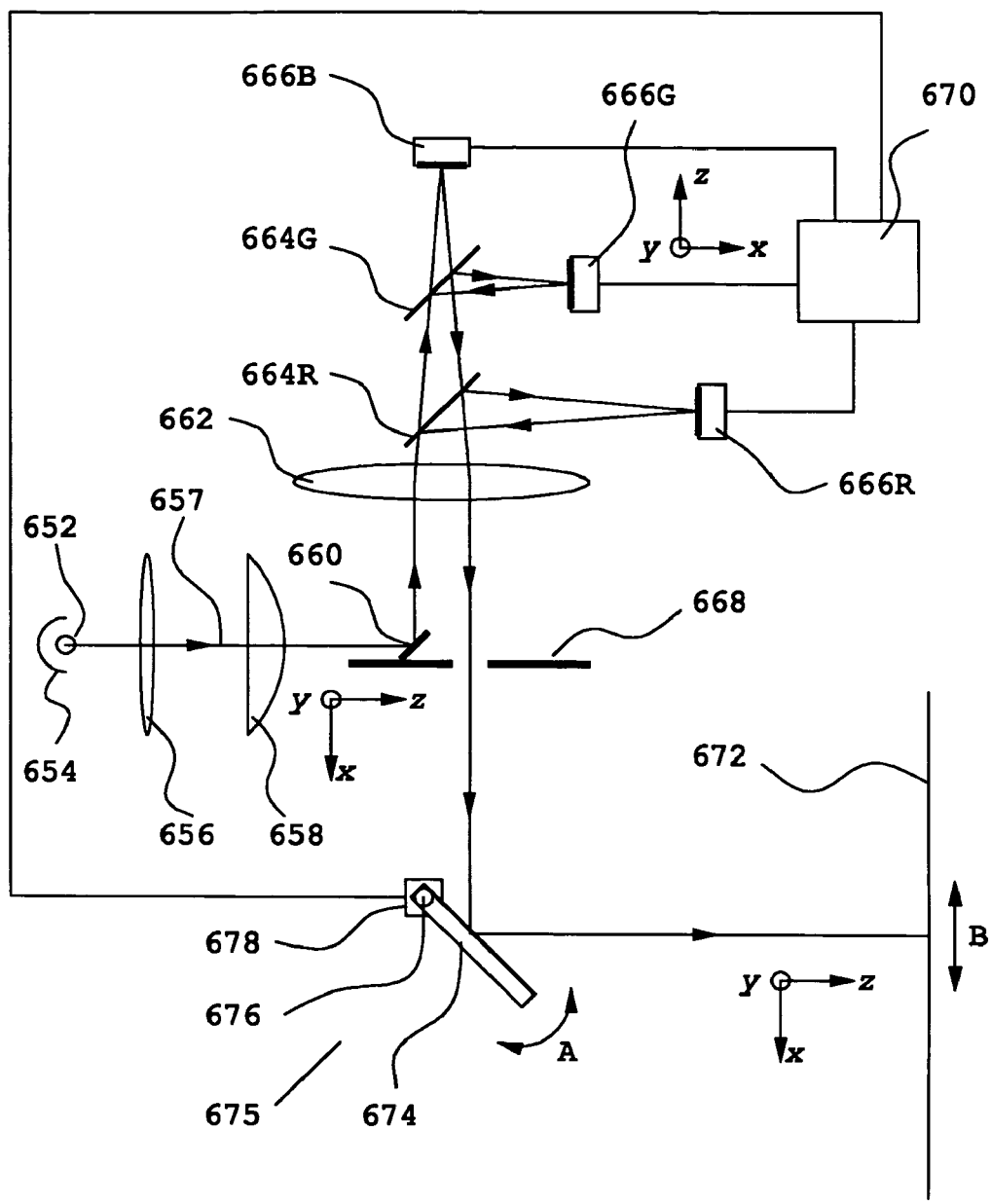
FIG. 24 is a general schematic representation of one embodiment of a direct pattern generating system comprising three one-dimensional ZPM arrays and a scanning means, arranged as a high performance color projection display system in a bright field configuration in accordance with the present invention.

FIG. 24 shows an embodiment of a color projection display system incorporating three 1-D ZPM arrays, one optimized for each colors (R, G, B), according to the present invention. Similar to the embodiment in FIG. 23, the color projection display system in FIG. 24 is also configured with a bright field arrangement and with an off-axis illumination system. Light waves are generated by a broadband light source 652. A reflector 654 behind the light source increases the collecting efficiency of the light source. A collimating lens assembly 656 collimates the illumination waves. A cylindrical lens assembly 658, placed behind the collimating lens assembly 656, has refractive power only in one axis (the x-direction according the coordinate convention as shown in FIG. 24), and causes the symmetrically collimated waves 657 to converge in the x-direction, and remain collimated in the y-direction. The cylindrical lens assembly 658 therefore transforms the symmetrically collimated waves 657 into a focused line on a strip mirror 660.

The strip mirror 660 is aligned in y-axis, on the optical axis of the illumination system, and is inclined at a 45 degree angle to the optical axis of the illumination system. The strip mirror 660 is placed near, but off the optical axis of an imaging lens assembly 662, and rotates the propagation direction of the illumination waves by 90 degrees. The illumination waves are re-collimated by imaging lens assembly 662.

The collimated illumination waves are separated into three colors in a similar way to the embodiment in FIG. 23. The first dichroic mirror 664R reflects red light towards the first 1-D ZPM array 666R, and allows green and blue lights to pass through. The second dichroic mirror 664G reflects green light towards the second 1-D ZPM array 666G, and allows blue light to pass through. The blue light waves, after passing the two dichroic mirrors, illuminate the third 1-D ZPM array 666B. All three 1-D ZPM arrays are aligned in y-axis and are properly positioned to receive the asymmetrical illumination waves. The three 1-D ZPM arrays are positioned at a substantially equal distance to the imaging lens assembly 662. Therefore, the front surfaces of all three 1-D ZPM arrays are at the conjugate planes of the projection screen 672. The light waves reflected from the three 1-D ZPM arrays 666R, 666G, and 666B recombine through the two dichroic mirrors 664R and 664G, and are imaged onto the projection screen 672 as line images of respective colors with a predetermined magnification.

To form a 2-D color image onto the projection screen 672, a scanning means 675 is inserted in the optical path between the imaging lens assembly 662, and the projection screen 672. The scanning means 675 comprises a scanning mirror 674 and a drive unit 678. The scanning mirror 674 rotates about an axis 676 through the drive unit 678 as indicated by the arrow A. As the scanning mirror 674 rotates, the line image scans up and down the projection screen 672 linearly, as indicated by the arrow B, to generate sequential line images. The scanning mirror 674 scans at a sufficient rate so that these sequential line images appear to be a 2-D image to the viewer. A control circuitry 670 sends separate RGB frame data to the three 1-D ZPM arrays cooperatively, and also synchronize the scanning means 675 with the modulations of the three 1-D ZPM arrays. Therefore a full color image is projected onto the projection screen 672 for viewing. Those skilled in the art the present invention pertains to will recognize that there are many ways to scan optical images. For example polygon scanning mirror is another way to scan the line images.

While examples of pattern generating systems in accordance with the present invention have been described with reference to arrays comprising reflective zone plate modulators, those skilled in the optical art will recognize that the principles of the present invention may be embodied in systems incorporating arrays comprising transmissive zone plate modulators. One type of transmissive zone plate modulators was disclosed by Toshio Naiki (US. Pub. No. 2002/0071172, filed on Dec. 12, 2001, published on Jan. 13, 2002), where acoustic waves were used as a modulation means.

Figure 25:
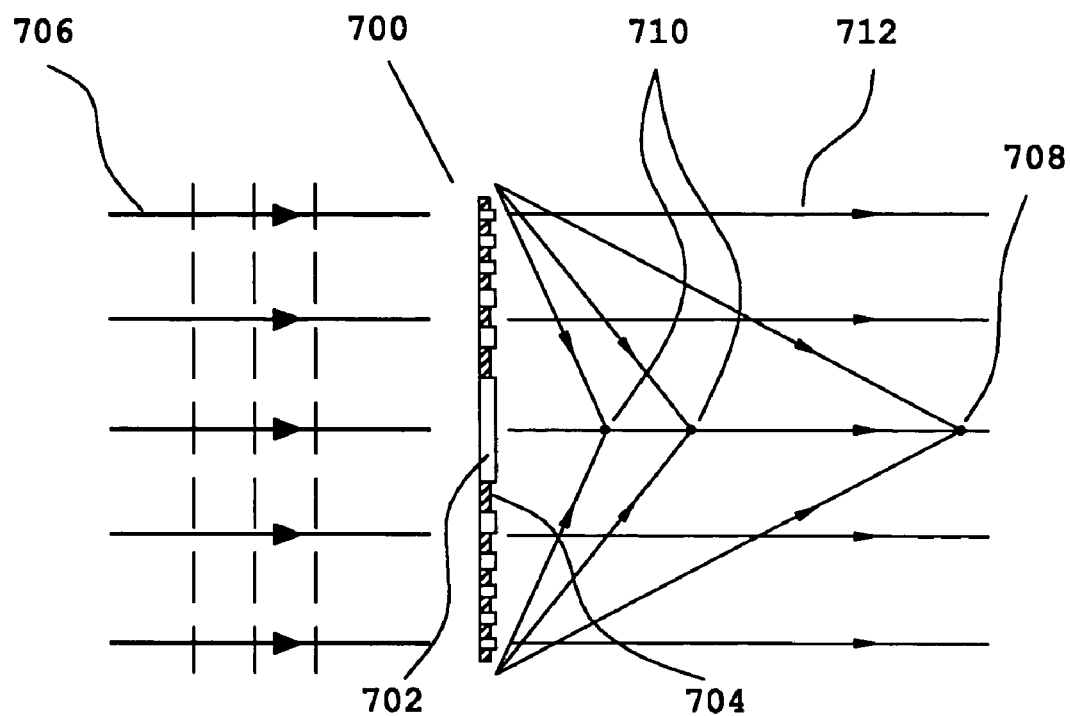
FIG. 25 is an illustration of a transmissive zone plate modulator in prior art.

As illustrated in FIG. 25, a transmissive zone plate modulator 700 comprises a pair of complementary zones, the odd zones 702 and the even zones 704. Both types of the zones are transparent to the illumination waves 706. The modulation is done by changing the optical path difference $\Delta=n_2 t_2 - n_1 t_1$ between the odd zones and the even zones by changing one or more of these parameters, $n_1$, $t_1$, $n_2$, and $t_2$, where $n_1$ and $t_1$ are the index of refraction and layer thickness of the odd zone materials, and $n_2$ and $t_2$ are the index of refraction and layer thickness of even zone materials. Accordingly, when illuminated with a plane wavefront 706, the transmissive zone plate modulator 700 diffracts and focus the illumination wavefront 706 into a series of focal points 708, 710 along the optical axis of the zone plate modulator when the $\Delta=(m/2+\frac{1}{2})\lambda$, and transmits the illumination wavefront undisturbed 712 when $\Delta=m/2\ \lambda$, where m is an integer, $\lambda$ is the wavelength of the illumination place wavefront. For any other value of $\Delta$, the transmitted waves are a mixture of focusing waves 708, 710 and undisturbed waves 712.

Figure 26:
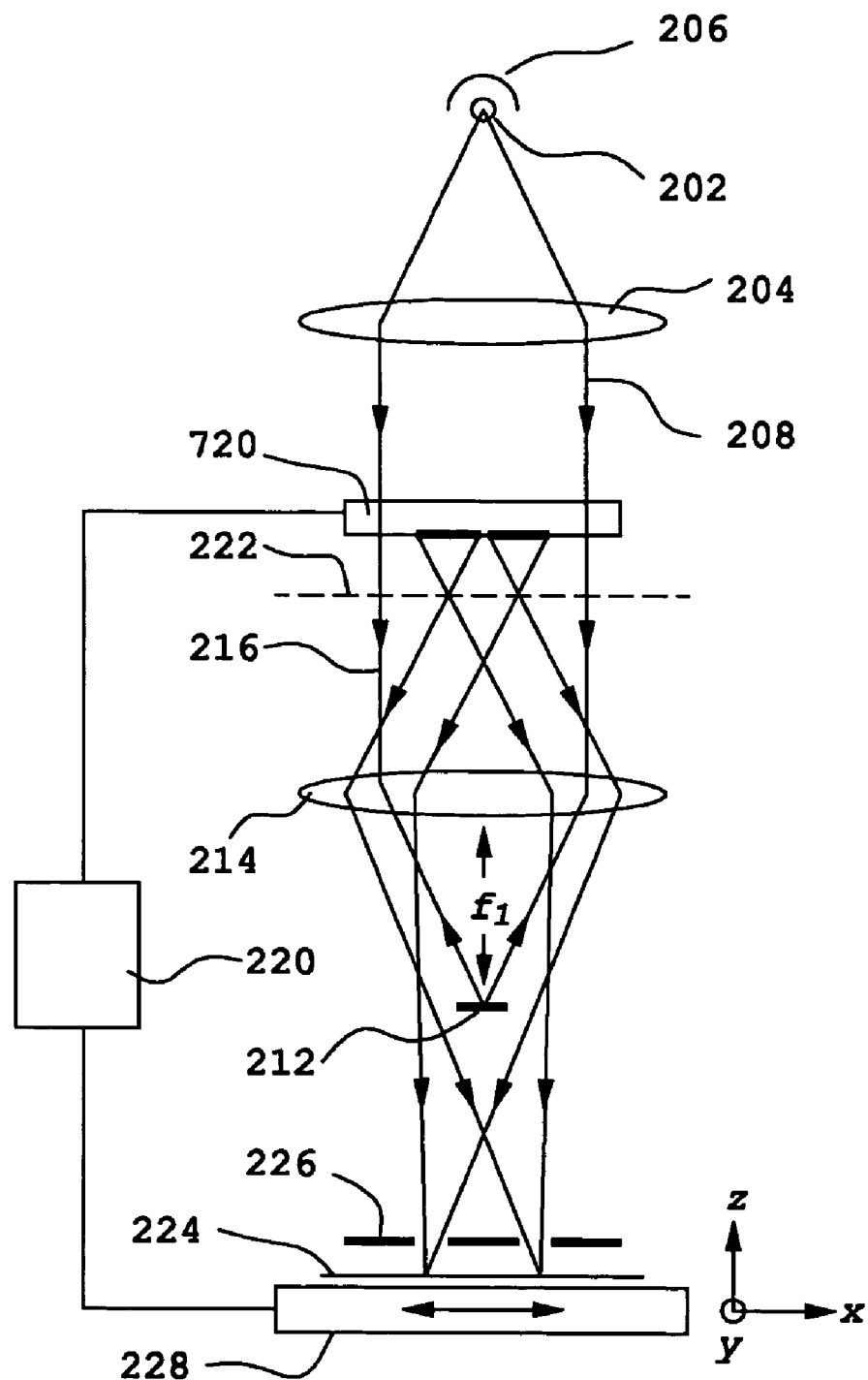
FIG. 26 is a general schematic representation of one embodiment of a large-field high-resolution pattern generating system comprising a transmissive ZPM array in accordance with the present invention.

A pattern generating system incorporating an array of transmissive zone plate modulators is illustrated in FIG. 26, which is similar to the system in FIG. 7 in most aspects. The major difference is that an array 720 of transmissive zone plate modulators is placed in between the collimating lens assembly 204 and the imaging lens assembly 214. The positions of the collimating lens assembly 204 and the light source 202 are re-arranged accordingly so that the array 720 of transmissive zone plate modulators is illuminated properly.

While the present invention has been in terms of a preferred and some other specific embodiments, and in terms of some specific examples and applications, it will be clear that this invention is not limited to these specific examples and embodiments, and various modifications or changes in light thereof will be obvious to persons skilled in the art and are to be included within the spirit and purview of this application.

What is claimed is:

1. An image generating system, comprising:
    a) a light generating means for producing illumination light waves;
    b) an array of zone plate modulators for producing modulated light waves, said zone plate modulators comprising:
        i) a pair of complementary Fresnel zone plates;
        ii) a modulation means for changing the optical path difference between said pair of complementary Fresnel zone plates;
    whereby said zone plate modulators cause diffractions of said illumination light waves incident thereon with the diffractions modulated by said modulation means, the diffracted portion of said illumination light waves incident upon each of said zone plate modulators is focused into a series of light spots along the axis of each of said zone plate modulators, and the diffracted portion of said illumination light waves incident upon said array of zone plate modulators form a light spot array on the primary focal plane of said array of zone plate modulators;
    c) an illumination means for causing said illumination light waves to be incident upon said array of zone plate modulators;
    d) an electronic means for processing pattern data to be presented and for operating said array of zone plate modulators according to the pattern data; and
    e) a receiving surface for receiving said modulated light waves originating from said array of zone plate modulators.

2. An image generating system of claim 1, further comprising a magnifying lens means for providing an image, with a predetermined magnification, from said zone plate modulators onto said receiving surface, wherein said magnifying lens means comprises lens elements of a type selected from the group of lens element types consisting of refractive lens elements, diffractive lens elements, and reflective focusing mirrors.

3. An image generating system of claim 2, further comprising a stopping means for blocking one of the diffracted portion and the undiffracted portion of said illumination light waves while allowing the other portion to propagate to said first receiving surface.

4. An image generating system of claim 1, wherein said receiving surface is a projection screen, further comprising a magnifying lens means, whereby said modulated light waves form an image on said projection screen through said magnifying lens means for viewing by a viewer.

5. An image generating system of claim 1, wherein said receiving surface comprises a movable photoconductive printing medium which moves cooperatively with the operation of said array of zone plate modulators via said electronic means, and said modulated light waves form a latent image on said movable photoconductive printing medium.

6. An image generating system of claim 1, wherein said receiving surface comprises a movable optical recording medium which moves cooperatively with the operation of said array of zone plate modulators via said electronic means, and said modulated light waves are recorded as data bits arranged in tracks on said movable optical recording medium.

7. An image generating system of claim 1, wherein said receiving surface comprises a substrate and a movable stage for holding said substrate, wherein said substrate is layered with photosensitive material of which one or more characteristics are modified by said modulated light waves, and said movable stage is substantially parallel to and is movable coplanar in a first and a second dimensions, and in a third dimension substantially perpendicular to said first and second coplanar dimensions, said movable stage provides three dimensional alignment and positioning of said receiving surface in response to control signals.

8. An image generating system of claim 1, wherein said zone plate modulators are zone plate modulators selected from the group consisting of reflective zone plate modulators and transmissive zone plate modulators.

9. A direct viewing system, comprising:
   a) a light generating means for producing illumination light waves;
   b) an array of zone plate modulators for producing modulated light waves, said zone plate modulators comprising:
      i) a pair of complementary Fresnel zone plates;
      ii) a modulation means for changing the optical path difference between said pair of complementary Fresnel zone plates;
   whereby said zone plate modulators cause diffractions of said illumination light waves incident thereon with the diffractions modulated by said modulation means, the diffracted portion of said illumination light waves incident upon each of said zone plate modulators is focused into a series of light spots along the axis of each of said zone plate modulators, and the diffracted portion of said illumination light waves incident upon said array of zone plate modulators form a light spot array on the primary focal plane of said array of zone plate modulators;
   c) an illumination means for causing said illumination light waves to be incident upon said array of zone plate modulators;
   d) an electronic means for processing pattern data to be presented and for operating said array of zone plate modulators according to the pattern data; and
   e) a magnifying lens means for providing a virtual image using said modulated light waves with a predetermined magnification, said virtual image being viewable by a viewer through said magnifying lens means.

10. A direct viewing system of claim 9, further comprising a stopping means for blocking one of the diffracted portion and the undiffracted portion of said illumination light waves while allowing the other portion to pass through.

11. A direct viewing system of claim 9, wherein said array of zone plate modulators is a two-dimensional array of zone plate modulators.

12. A direct viewing system of claim 9, wherein said zone plate modulators are zone plate modulators selected from the group consisting of reflective zone plate modulators and transmissive zone plate modulators.

13. A maskless lithography system, comprising:
   a) a wave source producing illumination waves;
   b) an array of zone plate modulators for producing modulated waves, said zone plate modulators comprising:
      i) a pair of complementary Fresnel zone plates;
      ii) a modulation means for changing the wave path difference between said pair of complementary Fresnel zone plates;
   whereby said zone plate modulators cause diffractions of said illumination waves incident thereon with the diffractions modulated by said modulation means, the diffracted portion of said illumination waves incident upon each of said zone plate modulators is focused into a series of wave spots along the axis of each of said zone plate modulators, and the diffracted portion of said illumination waves incident upon said array of zone plate modulators form a wave spot array on the primary focal plane of said array of zone plate modulators;
   c) an illumination means for causing said illumination waves to be incident upon said array of zone plate modulators;
   d) an electronic means for processing pattern data to be presented and for operating said array of zone plate modulators according to the pattern data; and
   e) a first receiving surface for receiving said modulated waves originating from said array of zone plate modulators.

14. A maskless lithography system of claim 13, wherein said illumination waves are a type of waves selected from the group consisting of electromagnetic waves and matter waves.

15. A maskless lithography system of claim 13, wherein said first receiving surface comprises wave sensitive materials of which one or more characteristics are modified by said modulated waves.

16. A maskless lithography system of claim 13, further comprising a magnifying lens means for providing an image, with a predetermined magnification, from said zone plate modulators onto said first receiving surface, wherein said magnifying lens means comprises lens elements of a type selected from the group of lens element types consisting of refractive lens elements, diffractive lens elements, and reflective focusing mirrors.

17. A maskless lithography system of claim 16, further comprising a stopping means for blocking one of the diffracted portion and the undiffracted portion of said illumination waves while allowing the other portion to propagate to said first receiving surface.

18. A maskless lithography system of claim 13, wherein said first receiving surface comprises a photo-charged particle converter for converting said wave spot array into a plurality of charged particle beams, further comprising a second receiving surface and a focusing-scanning means, said second receiving surface being layered with charged particle beam sensitive materials for receiving said charged particle beams, said focusing-scanning means focusing said charged particle beams, that originate from said photon-charged particle converter, onto said second receiving surface, and said focusing-scanning means scanning said charged particle beams coplanar in a first and a second dimensions substantially parallel to said second receiving surface.

19. A maskless lithography system of claim 13, wherein said first receiving surface is a photo-photon converter for converting said wave spot array into an array of electromagnetic waves having different wavelength.

20. A maskless lithography system of claim 13, wherein said array of zone plate modulators is a two-dimensional array of zone plate modulators.

21. A maskless lithography system of claim 13, wherein said array of zone plate modulators is an array of zone plate modulators selected from the group consisting of one-dimensional array of zone plate modulators and a staggered two-dimensional array of zone plate modulators, further comprising a second scanning means, whereby said array of zone plate modulators generates a substantially linear image, and said second scanning means scans the linear image in a direction substantially normal to the linear image to generate a two-dimensional image.

22. A maskless lithography system of claim 13, wherein said zone plate modulators are zone plate modulators selected from the group consisting of reflective zone plate modulators and transmissive zone plate modulators.

23. A method for generating patterns, comprising:
   a) generating illumination waves;
   b) providing an array of zone plate modulators for producing modulated waves, said zone plate modulators comprising:
      i) a pair of complementary Fresnel zone plates;
      ii) a modulation means for changing the wave path difference between said pair of complementary Fresnel zone plates;
   whereby said zone plate modulators cause diffractions of said illumination waves incident thereon with the diffractions modulated by said modulation means, the diffracted portion of said illumination waves incident upon each of said zone plate modulators is focused into a series of wave spots along the axis of each of said zone plate modulators, and the diffracted portion of said illumination waves incident upon said array of zone plate modulators form a first wave spot array on the primary focal plane of said array of zone plate modulators;
   (c) directing said illumination waves to incident upon said array of zone plate modulators;
   (d) processing pattern data to be presented electronically;
   (e) operating said array of zone plate modulators electronically according to the pattern data; and
   (f) receiving said modulated waves originating from said array of zone plate modulators and producing a patterned image.

24. A method of claim 23, further comprising separating the undiffracted portion of said illumination waves from the diffracted portion of said illumination waves by blocking one of the diffracted and the undiffracted waves while allowing the other to be received.

25. A method of claim 23, further comprising providing an image of said first wave spot array on the primary focal plane of said array of zone plate modulators, wherein said image is a second wave spot array.

26. A method of claim 25, further comprising scanning the wave spots of said second wave spot array to fill in the spaces around the wave spots of said second wave spot array along a first and a second coplanar dimensions.

27. A method of claim 23, wherein said array of zone plate modulators in step (b) is an array of zone plate modulators selected from the group consisting of reflective zone plate modulators and transmissive zone plate modulators.

28. A method of claim 23, wherein said array of zone plate modulators in step (b) comprises an array of zone plate modulators selected from the group consisting of one-dimensional array of zone plate modulators and a staggered two-dimensional array of zone plate modulators for generating substantially linear images, further comprising scanning said linear images in a direction substantially normal to said linear images to form a two-dimensional image.

29. A method of claim 23, further comprising converting said modulated light waves originating from said array of zone plate modulators into a second array of waves of a type selected from the group consisting of charged particle beams and electromagnetic waves.

* * * * *